United States Patent [19]
Lien et al.

[11] Patent Number: 6,101,116
[45] Date of Patent: Aug. 8, 2000

[54] SIX TRANSISTOR CONTENT ADDRESSABLE MEMORY CELL

[75] Inventors: Chuen-Der Lien, Los Altos Hills; Chau-Chin Wu, Cupertino; Tzong-Kwang Henry Yeh, Palo Alto, all of Calif.

[73] Assignee: Integrated Device Technology, Inc., Santa Clara, Calif.

[21] Appl. No.: 09/345,224

[22] Filed: Jun. 30, 1999

[51] Int. Cl.[7] .................................................. G11C 15/00
[52] U.S. Cl. .............................. 365/49; 365/154; 711/108
[58] Field of Search ....................... 365/49, 154; 711/108

[56] References Cited

U.S. PATENT DOCUMENTS

| | | | |
|---|---|---|---|
| 4,377,855 | 3/1983 | Lavi | 365/49 |
| 4,559,618 | 12/1985 | Houseman et al. | 365/49 |
| 4,646,271 | 2/1987 | Uchiyama et al. | 365/49 |
| 4,694,425 | 9/1987 | Imel | 365/49 |
| 4,723,224 | 2/1988 | Van Hulett et al. | 365/49 |
| 5,351,208 | 9/1994 | Jiang | 365/49 |
| 5,396,449 | 3/1995 | Atallam et al. | 365/49 |
| 5,440,709 | 8/1995 | Edgar | 395/401 |
| 5,699,288 | 12/1997 | Kim et al. | 365/49 |
| 5,715,188 | 2/1998 | Covino et al. | 365/49 |
| 5,933,363 | 8/1999 | Shindo | 365/49 |

*Primary Examiner*—Tan T. Nguyen
*Attorney, Agent, or Firm*—Bever, Hoffman & Harms, LLP; Julie A. Stephenson

[57] ABSTRACT

A six transistor content addressable memory (CAM) cell that prevents disturb of non-written rows during a write operation. The CAM cell comprises an SRAM cell having a pair of cross-coupled inverters and a pair of access transistors. The SRAM cell stores a data value at the output node of one of the inverters and an inverse data value at the output node of the other one of the inverters. An access transistor is connected between each output node and a match line. The match line is connected across the access transistors such that the match line is coupled to the output nodes of the inverters when the access transistors are turned on. Data lines are connected to the gates of the access transistors, and are coupled to receive a data value and an inverse data value. The 6-T CAM cell of this embodiment can be coupled to a plurality of identical 6-T CAM cells to form an array. Each row of CAM cells is coupled to the same match line. Data values are written to and compared with data values stored within each CAM cell. A match condition is sensed on the match line. This 6-T CAM cell is therefore available for reliable use in a storage array. An additional benefit of the 6-T CAM cell is the small cell area due to the small number of transistors.

17 Claims, 17 Drawing Sheets

SIX TRANSISTOR CONTENT ADDRESSABLE MEMORY CELL

BACKGROUND OF THE INVENTION

1. Field of the Invention

The present invention relates to content addressable memory (CAM) cells. More specifically, the present invention relates to six transistor CAM cells and methods for operating these cells in an array.

2. Discussion of Related Art

CAM cells are defined as memory cells that are addressed in response to their content, rather than by a physical address within an array. FIG. 1 is a block diagram of a conventional memory array formed using twelve CAM cells. The CAM cells are labeled $M_{X,Y}$, where X is the row of the array, and Y is the column of the array. Thus, the array includes CAM cells $M_{0,0}$ to $M_{2,3}$. Each of the CAM cells is programmed to store a data value. In the described example, the data value stored in each CAM cell is indicated by either a "0" or a "1" in brackets. For example, CAM cells $M_{0,0}$, $M_{0,1}$, $M_{0,2}$ and $M_{0,3}$ store data values of 0, 1, 0 and 0, respectively. Each row of CAM cells is coupled to a common match line. For example, CAM cells $M_{0,0}$, $M_{0,1}$, $M_{0,2}$ and $M_{0,3}$ are coupled to match line $MATCH_0$.

The array of CAM cells is addressed by providing a data value to each column of CAM cells. Thus data values $D_0$, $D_1$, $D_2$ and $D_3$ are provided to columns 0, 1, 2 and 3, respectively. Note that inverted data values $D_0\#$, $D_1\#$, $D_2\#$ and $D_3\#$ are also provided to columns 0, 1, 2 and 3, respectively. If the data values stored in a row of the CAM cells match the applied data values $D_0$, $D_1$, $D_2$ and $D_3$, then a match condition occurs. For example, if the data values $D_0$, $D_1$, $D_2$ and $D_3$ are 0, 1, 0 and 0, respectively, then the data values stored in the CAM cells of row 0 match the applied data values. Under these conditions, the $MATCH_0$ signal is asserted high. Because the applied data values $D_0$, $D_1$, $D_2$ and $D_3$ do not match the data values stored in the CAM cells of rows 1 or 2, the $MATCH_1$ and $MATCH_2$ signals are de-asserted low. The match signals $MATCH_0$–$MATCH_2$ can be used for various purposes, such as implementing virtual addressing, in a manner known to those skilled in the art.

Many different types of CAM cells have been designed. One important consideration in the design of a CAM cell is the number of transistors required to implement the cell. In general, it is desirable to have a CAM cell that is implemented using a relatively small number of transistors, such that the layout area of the CAM cell is minimized. However, there are problems associated with implementing a CAM cell using a small number of transistors.

FIG. 2 is a circuit diagram of a pair of conventional six transistor CAM cells 10 and 20. CAM cell 10 includes p-channel transistors 13–14 and n-channel transistors 11–12 and 15–16. Transistors 11–14 are connected to form a pair of cross-coupled inverters that store a data value. This data value is defined by the states of nodes 18 and 19. For example, if node 18 is at a logic high state, and node 19 is at a logic low state, then CAM cell 10 stores a logic "1" data value. In the described example, CAM cell 10 is programmed to store a logic "1" data value. The drains of transistors 15 and 16 are connected to nodes 18 and 19, respectively, and the sources of transistors 15 and 16 are connected to control lines 5 and 6, respectively. The gates of transistors 15 and 16 are connected to control lines 1 and 2, respectively. CAM cell 20, which includes p-channel transistors 23–24 and n-channel transistors 21–22 and 25–26, is connected in a manner similar to CAM cell 10. In the described example, CAM cell 20 is programmed to store a logic "0" data value (i.e., node 28 is low and node 29 is high). CAM cells 10 and 20 are commonly connected to control lines 5 and 6 as illustrated.

The data values stored in CAM cells 10 and 20 are compared with applied data values as follows. Data values $D_0$ and $D_1$ are applied to control lines 1 and 3, respectively (and inverted data values $D_0\#$ and $D_1\#$ are provided to control lines 2 and 4, respectively). In the described example, applied data values $D_0$ and $D_1$ are both logic high values. Control lines 5 and 6 are both held at a logic high value during the comparison operation. Under these conditions, the data value stored in CAM cell 10 matches the applied data value $D_0$, but the data value stored in CAM cell 20 does not match the applied data value $D_1$.

Within CAM cell 10, the logic high applied data value $D_0$ turns on transistor 15, thereby coupling node 18 to control line 5. Because both node 18 and control line 5 are held at logic high values, CAM cell 10 does not tend to change the voltage on control line 5. Also within CAM cell 10, the logic low data value $D_0\#$ turns off transistor 16, thereby de-coupling node 19 from control line 6. As a result, CAM cell 10 does not tend to change the logic high values applied to lines 5 and 6. If all of the CAM cells in the row match all of the applied data values, both lines 5 and 6 will remain at logic high values, thereby indicating that a match condition exists.

However, as described above, the logic low data value stored in CAM cell 20 does not match the logic high applied data value $D_1$. Within CAM cell 20, the logic high applied data value $D_1$ causes transistor 25 to turn on, thereby coupling node 28 to control line 5. Node 28 is coupled to ground through turned on transistor 22. As a result, the logic high voltage on control line 5 is pulled down. This reduced voltage on control line 5 is interpreted as a non-match condition.

A problem may exist if there are many non-matching CAM cells in the same row. In this case, all of the non-matching CAM cells pull down on control line 5. If the voltage of control line 5 becomes too low, the state of matching CAM cell 10 can flip from a logic high value to a logic low value. CAM cells 10 and 20 are described in more detail in U.S. Pat. No. 5,351,208. A similar six transistor CAM cell, in which control lines 5 and 6 are combined into a single control line, is described in U.S. Pat. No. 4,694,425.

It would therefore be desirable to have a six transistor CAM cell that is not as susceptible to disturb conditions during compare operations as the above described six transistor CAM cell.

SUMMARY

Accordingly, the present invention provides a six transistor CAM cell that prevents disturb of non-written rows during a write operation. The CAM cell comprises an SRAM cell having a first inverter cross-coupled with a second inverter, a first access transistor having a source coupled to the output node of the first inverter, and a second access transistor having a source coupled to the output node of the second inverter. The state of the output node of the first inverter defines the data value stored in the CAM cell, and the state of the output node of the second inverter defines the inverse of the data value stored in the CAM cell. A match line is commonly coupled to the drains of the first and second access transistors. Data lines are coupled to the gates of the first and second access transistors. Write data values and comparison data values are provided to the CAM cell by the data lines and the match line.

A plurality of CAM cells can be coupled in a row, with each of the CAM cells in the row being commonly coupled to the match line in the above-described manner. If a comparison operation within the row results in a large number of non-matching CAM cells and a small number of matching CAM cells, the large number of non-matching CAM cells will tend to pull the voltage on the match line down to a level that could flip the states of a matching CAM cells. As a result, a voltage clamping circuit is coupled to the match line. The voltage clamping circuit allows the voltage on the match line to drop when there are non-matching CAM cells, but prevents the voltage on the match line from dropping to undesirably low levels during a comparison operation.

In this manner, a six transistor SRAM cell can be reliably used as a CAM cell. This six transistor SRAM cell advantageously has a smaller layout area than CAM cells that require more than six transistors.

In another embodiment of the present invention, another six transistor CAM cell is provided. In this embodiment, the CAM cell comprises an SRAM cell having a first inverter cross-coupled with a second inverter, a first access transistor having a source coupled to the output node of the first inverter, and a second access transistor having a source coupled to the output node of the second inverter. The state of the output node of the first inverter defines the data value stored in the CAM cell, and the state of the output node of the second inverter defines the inverse of the data value stored in the CAM cell. The first and second inverters are powered by a first voltage supply and a ground voltage supply. The ground voltage supply is coupled to a match line. A compare line is coupled to the drains of the first and second access transistors. Data lines are coupled to the gates of the first and second access transistors. Write data values and comparison data values are provided to the CAM cell by the data lines and the compare line.

A plurality of CAM cells can be coupled in a row, with each of the CAM cells in the row being commonly coupled to the match line and the compare line in the above-described manner. In this manner, a six transistor SRAM cell can be reliably used as a CAM cell. This six transistor SRAM cell advantageously has a smaller layout area than CAM cells that require more than six transistors.

Two additional access transistors and a row access line may be added to each CAM cell to enable low power operation of the CAM cell and prevent write disturb conditions in the CAM cell.

In another embodiment, one of more read access transistors can be coupled to the output nodes of the CAM cell, thereby adding a read capability to the CAM cell.

The present invention will be more fully understood in view of the following description and drawings.

DETAILED DESCRIPTION

Figure 1:
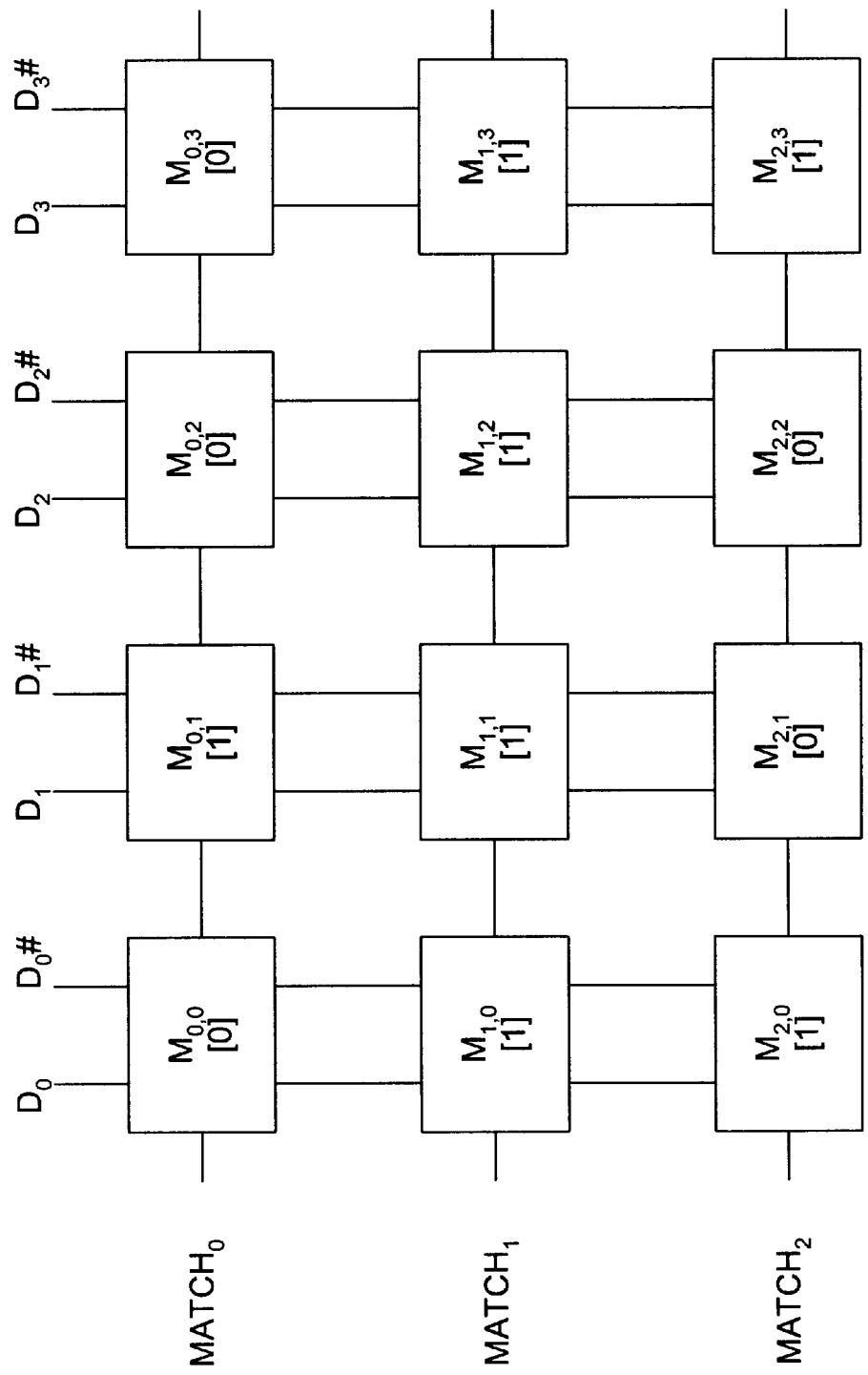
FIG. 1 is a block diagram of a conventional array of CAM cells.
Figure 2:
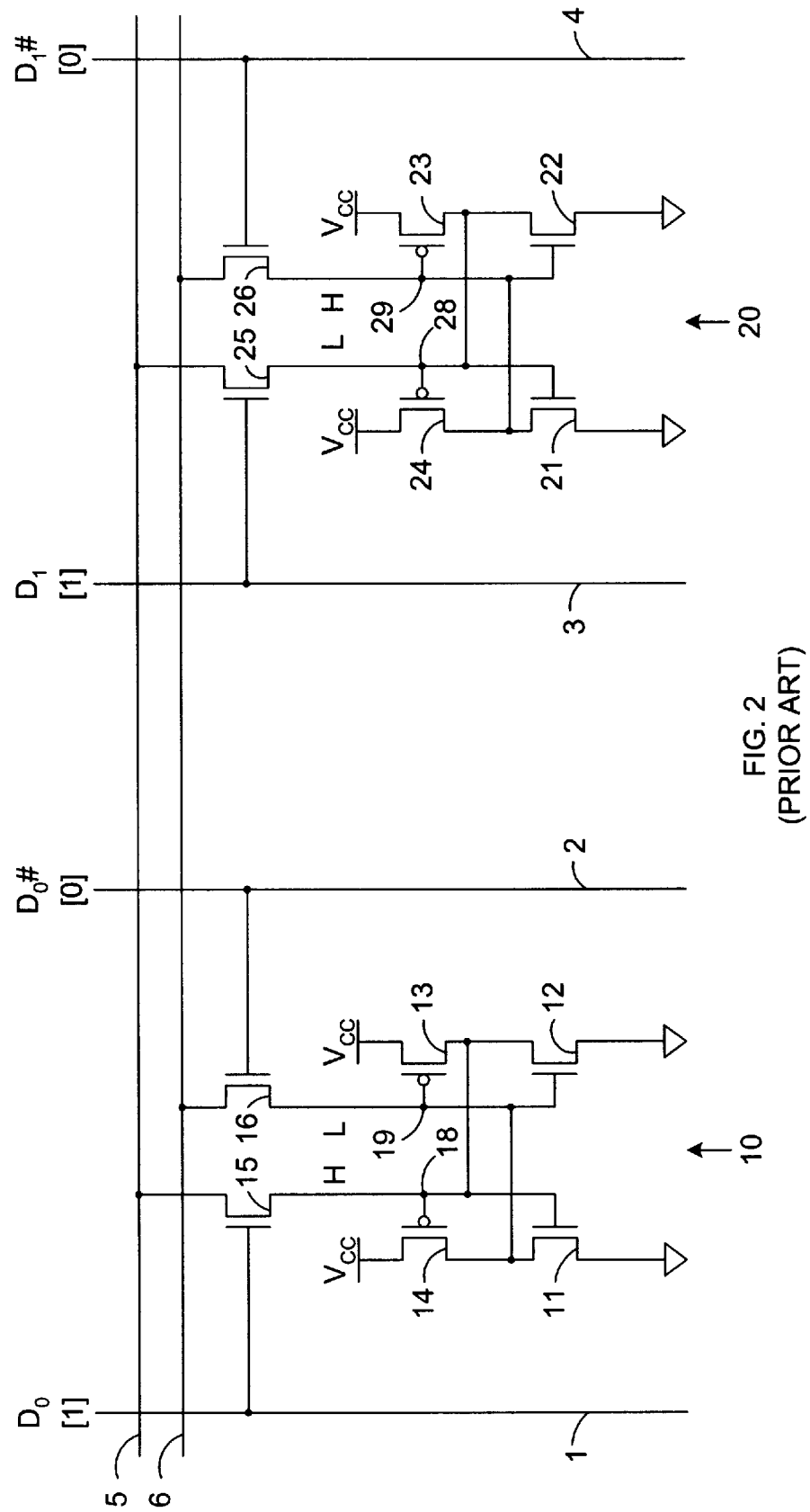
FIG. 2 is a circuit diagram of a pair of conventional six transistor CAM cells.
Figure 3A:
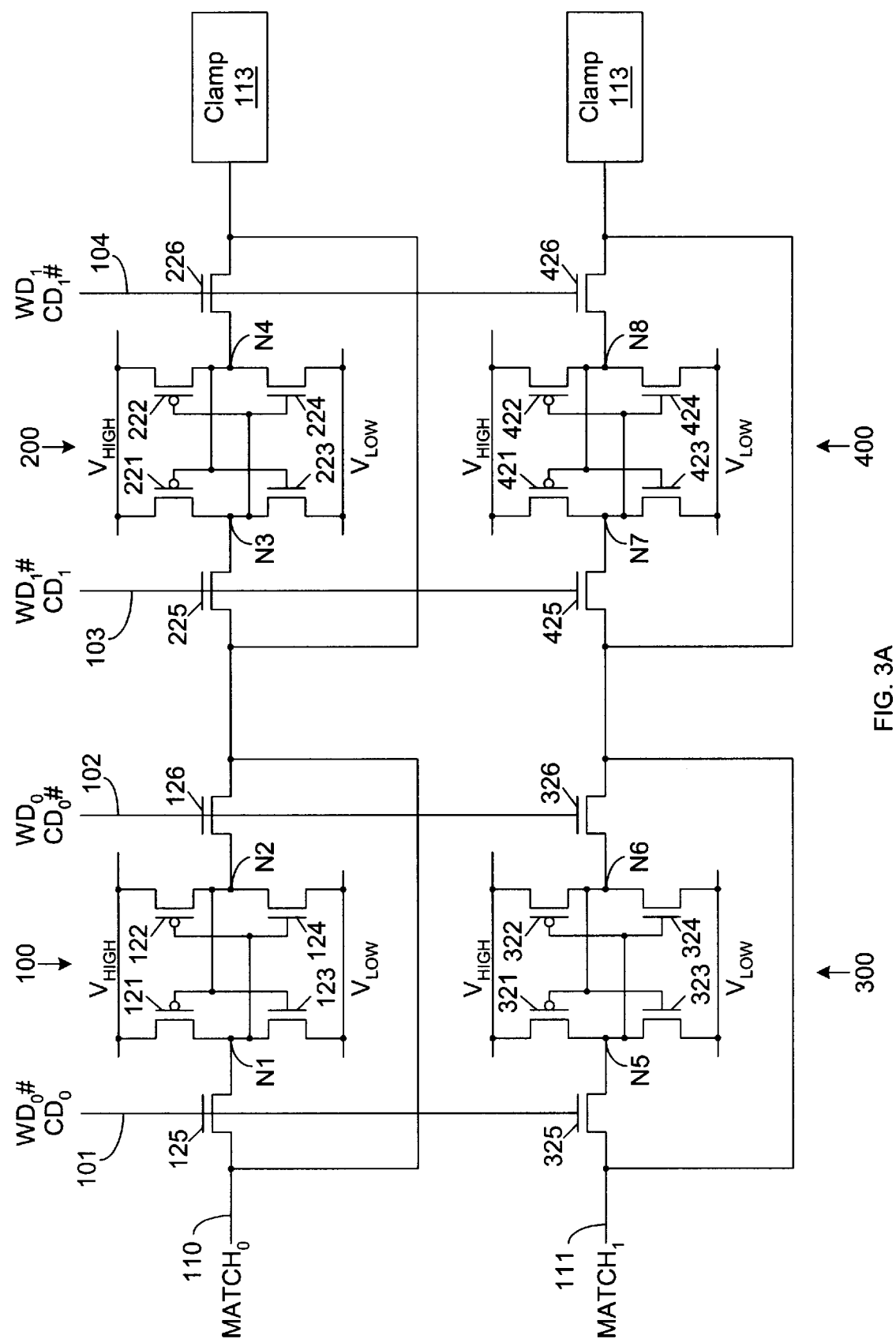
FIG. 3A is a schematic diagram of an array of six-transistor CAM cells in accordance with one embodiment of the present invention.

FIG. 3A is a schematic diagram of an array of six-transistor CAM cells 100, 200, 300 and 400 in accordance with one embodiment of the present invention. CAM cell 100 includes column data lines 101 and 102, match line 110, p-channel transistors 121–122, and n-channel transistors 123–126. Transistors 121 and 123 are connected in series between the $V_{HIGH}$ supply terminal and the $V_{LOW}$ supply terminal to form a first inverter. The output of this first inverter is labeled node N1. Similarly, transistors 122 and 124 are connected between the $V_{HIGH}$ supply terminal and the $V_{LOW}$ supply terminal to form a second inverter. The output terminal of this second inverter is labeled node N2. Transistors 121–124 are connected to form a pair of cross coupled inverters that store a data value. As described above, this data value is defined by the states of nodes N1 and N2. For example, if node N1 is at a logic high state and node N2 is at a logic low state then CAM cell 100 stores a logic "1" data value.

N-channel transistors 125–126 are coupled as access transistors between match line 110 and nodes N1 and N2, respectively. The gates of transistors 125–126 are coupled to column data lines 101 and 102, respectively. Column data line 101 is coupled to receive inverse write data value $WD_0\#$ and compare data value $CD_0$. Column data line 102 is coupled to receive write data value $WD_0$ and inverse compare data value $CD_0\#$.

CAM cell 200 includes column data lines 103 and 104, match line 110, p-channel transistors 221–222, and n-channel transistors 223–226. The elements of CAM cell 200 are connected in the same manner as the elements of CAM cell 100. The gates of transistors 225–226 are coupled to column data lines 103 and 104, respectively. Column data line 103 is coupled to receive inverse write data value $WD_1\#$ and compare data value $CD_1$. Column data line 104 is coupled to receive write data value $WD_1$ and inverse compare data value $CD_1\#$. CAM cells 100 and 200 are commonly connected to match line 110.

CAM cell 300 includes column data lines 101 and 102, match line 111, p-channel transistors 321–322, and n-channel transistors 323–326. Similarly, CAM cell 400 includes column data lines 103 and 104, match line 111, p-channel transistors 421–422, and n-channel transistors 423–426. The elements of CAM cells 300 and 400 are connected in the same manner as CAM cell 100. CAM cells 300 and 400 are commonly connected to match line 111. Note that CAM cells 100 and 300 share column data lines 101–102. Similarly, CAM cells 200 and 400 share column data lines 103–104.

Although the array illustrated in FIG. 3A has only two rows and two columns of CAM cells, it is understood that this array can be expanded to include many more rows and columns of CAM cells. The manner of expansion is obvious in view of the 2×2 array of CAM cells 100, 200, 300 and 400 shown in FIG. 3A. In a particular example, an array of CAM cells includes eight rows and seventy-two columns of CAM cells.

The operation of CAM cells 100, 200, 300, and 400 will now be described. During normal operation, CAM cells 100, 200, 300 and 400 are placed in various conditions, including standby, write, no-disturb and compare. A standby condition exists when CAM cells 100, 200, 300, and 400 are not undergoing a write or comparison operation. During a standby condition, column data lines 101–104 are set to a logic low value of 0 Volts, thereby turning off access transistors 125–126, 225–226, 325–326, and 425–426 and isolating CAM cells 100, 200, 300 and 400 from match lines 110 and 111. Match lines 110–111 can be held at a logic low value of 0 Volts or a logic high value of $V_{CC}$, but $V_{CC}$ is preferred. $V_{CC}$ is defined as the nominal supply voltage of the system. In the described embodiment, $V_{CC}$ is 3.3 Volts, however, other voltages can be used. For example, in another embodiment, $V_{CC}$ might be 2.5 Volts. $V_{HIGH}$ is held at a voltage $V_{CC}$, and $V_{LOW}$ is held at a voltage of 0 Volts.

A write operation is performed as follows. The data values (and the associated inverse data values) to be written to a row of CAM cells are provided to column data lines 101–104. The match line associated with the row to be written is held at a voltage of 0 Volts, and the match lines associated with the rows that are not written are held at a voltage equal to the $V_{CC}$ supply voltage. For example, write data values $WD_0$ and $WD_1$ having logic "1" and "0" values, respectively, are written to row 0 of CAM cells (e.g., CAM cells 100 and 200) as follows. Write data values $WD_0$ and $WD_1$ are applied to column data lines 102 and 104, respectively. Inverse write data values $WD_0\#$ and $WD_1\#$ are applied to column data lines 101 and 103, respectively. Therefore, column data lines 101 and 104 are held at logic low values, and column data lines 102 and 103 are held at logic high values. Match line 110 is held to a logic low value of 0 Volts, $V_{HIGH}$ is held to a logic high value of $V_{CC}$ and $V_{LOW}$ is held to a logic low value of 0 Volts.

The logic high state of column data lines 102 and 103 turn on access transistors 126 and 225, thereby applying the logic low voltage of match line 110 to nodes N2 and N3. The logic low voltage applied to nodes N2 and N3 turn on p-channel transistors 121 and 222, respectively. As a result, nodes N1 and N4 are pulled up to a logic high state. The high voltages on nodes N1 and N4 turn on transistors 124 and 223. As a result, nodes N2 and N3 are pulled down to a logic low state. Under these conditions, CAM cell 100 is in a logic "1" state and CAM cell 299 is in a logic "0" state.

After write data values $WD_0$, $WD_0\#$, $WD_1$, and $WD_1\#$ have had sufficient time to be latched into CAM cells 100 and 200, logic low voltages are applied to lines 101–104, thereby turning off access transistors 125–126 and 225–226 and latching the write data values $WD_0$, $WD_0\#$, $WD_1$, and $WD_1\#$ in CAM cells 100 and 200. That is, CAM cells 100, 200, 300 and 400 are then reset to a standby condition.

Note that while write data values $WD_0$, and $WD_1$ are written to CAM cells 100 and 200, the non-written rows (e.g., CAM cells 300 and 400) are held in a no-disturb condition. A no-disturb condition is defined as a condition in which the contents of a CAM cell are not disturbed, even if the access transistors of the CAM cell are turned on. To maintain row 1 (e.g., CAM cells 300 and 400) in a no-disturb condition while row 0 is written, match line 111 is held at a logic high voltage of $V_{CC}$. $V_{HIGH}$ and $V_{LOW}$ are controlled as described above.

During the above-described write operation, the logic high state of column data lines 102 and 103 turn on access transistors 326 and 425 of CAM cells 300 and 400, respectively. If node N6 is initially latched in a logic high state, then the $V_{CC}$ voltage on match line 111, being a logic high voltage, will not disturb the state of CAM cell 300. Similarly, if node N7 is initially latched in a logic high state, then the $V_{CC}$ voltage on match line 111, being a logic high voltage, will not disturb the state of CAM cell 400. Moreover, if node N6 is initially latched in a logic low state, then both access transistor 326 and transistor 324 are turned on. The cell ratio of transistors 326 and 324 is chosen so that the voltage of node N6 in this configuration is not high enough to turn on transistor 323, thereby preventing the write operation of CAM cell 100 from disturbing the contents of CAM cell 300. The cell ratio of the transistors in each of cells 100–400 are similarly chosen so that write operations do not disturb non-written rows.

A comparison operation is performed as follows. The data values (and the associated inverse data values) to be compared to each row of CAM cells are provided to column data lines 101–104. The match lines are held to logic high values. A compare operation is simultaneously performed within each CAM cell of the array. For example, the data values stored in CAM cells 100 and 200 (e.g. 1 and 0) are compared with compare data values $CD_0$ and $CD_1$ (e.g. 1 and 1) as follows. For purposes of clarity, a compare operation within CAM cells 100 and 200 is described in detail. The compare operations performed within CAM cells 300 and 400 are performed in a similar manner to the compare operations performed within CAM cells 100 and 200.

Compare data values $CD_0$ and $CD_1$ are applied to column data lines 101 and 103, respectively (and inverted compare data values $CD_0\#$ and $CD_1\#$ are provided to column data lines 102 and 104, respectively). In the described example, compare data values $CD_0$ and $CD_1$ are both logic high values. Match line 110 is held to a logic high value. Under these conditions, the data value stored in CAM cell 100 matches the compare data value $CD_0$, but the data value stored in CAM cell 200 does not match the compare data value $CD_1$.

Column data lines 101 and 103 are coupled to receive compare data values $CD_0$ and $CD_1$, respectively. Column data lines 102 and 104 are coupled to receive inverse compare data values $CD_0\#$ and $CD_1\#$, respectively. Match lines 110 and 111 are initially set to a logic high value of $V_{CC}$, $V_{HIGH}$ is held to a logic high value of $V_{CC}$ and $V_{LOW}$ is held to a logic low value of 0 Volts.

Within CAM cell 100, the logic high compare data value $CD_0$ turns on transistor 125, thereby coupling node N1 to match line 110. Because both node N1 and match control line 110 are held at logic high values, CAM cell 100 does not tend to change the voltage on match control line 110. Also within CAM cell 100, the logic low compare data value $CD_0\#$ turns off transistor 126, thereby de-coupling node N2 from match control line 110. As a result, CAM cell 100 does not tend to change the logic high value applied to match control line 110. If all of the CAM cells in the row match all of the applied data values, match control line 110 will remain at a logic high voltage, thereby indicating that a match condition exists.

However, as described above, the logic low data value stored in CAM cell 200 does not match the logic high compare data value $CD_1$. Within CAM cell 200, the logic high compare data value $CD_1$ causes transistor 225 to turn on, thereby coupling node N3 to match control line 110. Node N3 is coupled to ground through turned on transistor 223. As a result, the logic high voltage on control line 110 is pulled down. This reduced voltage on match control line 110 is interpreted as a non-match condition by a voltage sensor circuit. In a particular embodiment, the non-match condition is sensed by the voltage sensor circuit of FIG. 3B, which is described in more detail below. Match control line 110 is clamped to prevent the low voltage associated with a non-match condition from dropping low enough to flip the contents of the matching CAM cells. A particular embodiment utilizes a diode clamp coupled between $V_{CC}$ and match control line 110 to prevent the match line from dropping low enough to flip the contents of the matching CAM cells.

The data values stored in CAM cells 300 and 400 are compared to the data values on lines 101–104 in a similar fashion, and the resulting voltage on match line 111 is sensed for a match/non-match condition. CAM cells 100, 200, 300 and 400 are then reset to a standby condition.

Figure 3B:
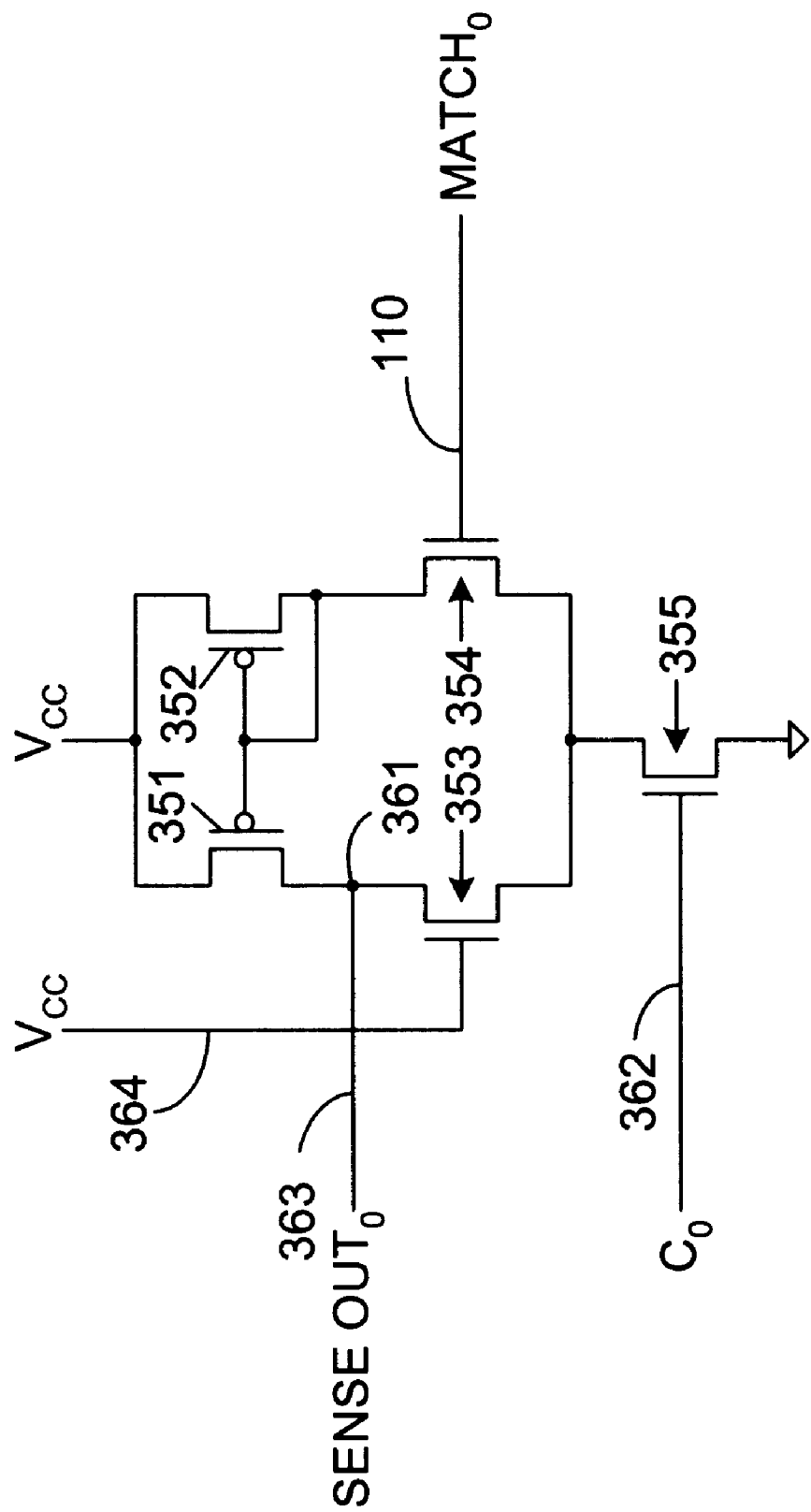
FIG. 3B is a schematic diagram of a differential sense amplifier for use with the CAM cell array of FIG. 3A.

FIG. 3B is a schematic diagram of a differential sense amplifier for use with the CAM cell array of FIG. 3A. The differential sense amplifier of FIG. 3B includes p-channel transistors 351–352 and n-channel transistors 353–355. Transistors 351 and 353 are coupled in series between the $V_{CC}$ supply voltage and transistor 355. Node 361 is the output node of the differential sense amplifier, and is coupled to sense out line 363. The gate of transistor 353 is coupled to the $V_{CC}$ supply voltage. Transistors 352 and 354 are coupled in series between the $V_{CC}$ supply voltage and transistor 355. The gate of transistor 354 is coupled to match line 110 (FIG. 3A). The gates of transistors 351–352 are coupled to each other and to the drain of transistor 352. Transistor 355 has a gate coupled to compare enable line 362, a source coupled to the drains of transistors 353–354, and a drain coupled to ground. Thus, the differential amplifier is connected as a current mirror circuit, wherein the current through transistors 352 and 354 is equal to the current through transistors 351 and 353. The voltage applied to the gate of transistor 354 therefore controls the voltage provided at output node 363.

During a compare operation, the $C_0$ signal is asserted high, thereby enabling the differential amplifier. As described above, match line 110 is initially held at a voltage equal to the $V_{CC}$ supply voltage. If a match condition exists, match line 110 remains at the $V_{CC}$ voltage. Thus, the $V_{CC}$ supply voltage is applied to the gates of transistors 353 and 354. In response to this condition, the differential amplifier provides a logic high SENSE $OUT_0$ signal on node 363.

If a non-match condition exists, match line 110 is pulled down below the $V_{CC}$ supply voltage in the manner described above. Thus, the voltage applied to the gate of transistor 354 is less than the voltage applied to the gate of transistor 353. In response to this condition, the differential amplifier provides a logic low SENSE $OUT_0$ signal on node 363.

Figure 4:
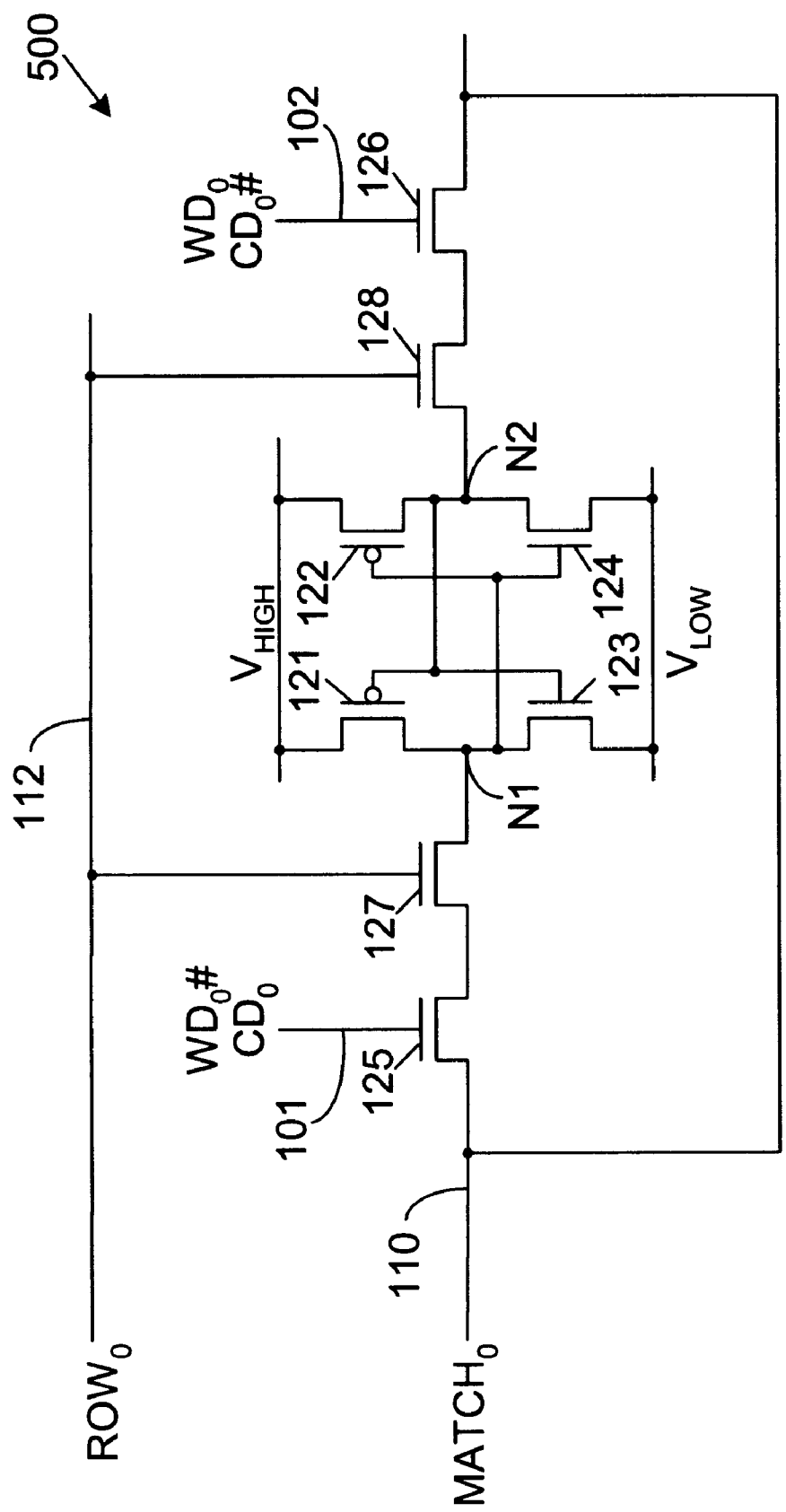
FIG. 4 is a schematic diagram of an 8-T CAM cell in accordance with one variation of the embodiment of FIG. 3A.

FIG. 4 is a schematic diagram of an 8-T CAM cell 500 in accordance with one variation of the present invention. Similar elements in CAM cell 100 (FIG. 3A) and CAM cell 500 are labeled with similar reference numbers. CAM cell 500 includes the same elements as CAM cell 100, with the addition of transistors 127–128 and row enable line 112. A plurality of CAM cells similar to CAM cell 500 may be connected in an array in the same fashion as CAM cells 100, 200, 300 and 400 (FIG. 3A).

CAM cell 500 operates in a manner similar to CAM cell 100. However, a logic low voltage applied to row enable line 112 effectively disables CAM cell 500, while a logic high voltage applied to row enable line 112 effectively enables CAM cell 500.

Thus, during standby, row 0 is held to a logic low voltage, thereby turning off access transistors 127 and 128 to de-couple nodes N1 and N2 from column data lines 101 and 102 and match line 110. During a write operation, row 0 is held to a logic high value, thereby turning on access transistors 127 and 128. Under these conditions, CAM cell 500 operates in the same manner as CAM cell 100.

The non-written rows are kept in a no-disturb state. In the no-disturb state, row 0 is held to a logic low voltage, thereby turning off access transistors 127 and 128. As a result, nodes N1 and N2 are de-coupled from column data lines 101 and 102 and match line 110.

During a compare operation, row 0 is held to a logic high value, thereby turning on access transistors 127 and 128. Under these conditions, CAM cell 500 operates in the same manner as CAM cell 100.

8-T CAM cell 500 has an advantage over 6-T CAM cell 100 (FIG. 3A) in that CAM cell 500 requires less power than CAM cell 100 to perform a write operation, lessening the chance of disturbing adjacent rows. 6-T CAM cell 100 requires the match lines of non-written rows to be held at a logic high value. 8-T CAM cell 500 can disable non-written rows by grounding the associated row enable line. Grounding a line consumes less power than holding a line to a logic high value.

Figure 5:
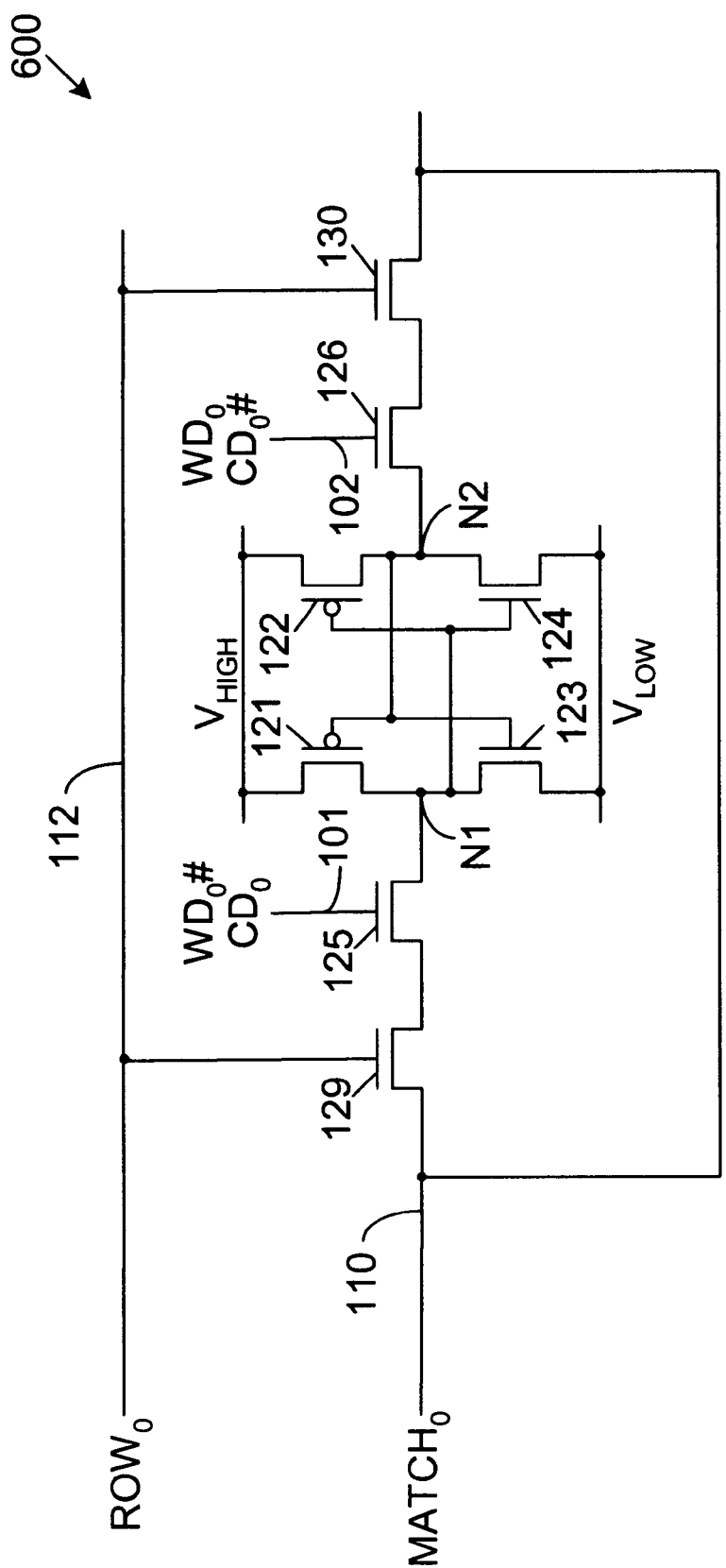
FIG. 5 is a schematic diagram of an 8-T CAM cell in accordance with another variation of the embodiment of FIG. 3A.

FIG. 5 is a schematic diagram of an 8-T CAM cell 600 in accordance with another variation of the present invention. Similar elements in CAM cell 100 (FIG. 3A) and CAM cell 600 are labeled with similar reference numbers. CAM cell 600 includes the same elements as CAM cell 100, with the addition of access transistors 129–130 and row enable line 112. Access transistors 129–130 are similar to access transistors 127–128 (FIG. 4), but are located outside of transistors 125–126, rather than inside of transistors 125–126. Standby conditions and write and compare operations are performed in the same manner as with CAM cell 500 (FIG. 4). However, row enable line 112 and access transistors 129–130 instead operate to couple (logic high $ROW_0$ value) or de-couple (logic low $ROW_0$ value) transistors 125–126 to match line 110.

Figure 6A:
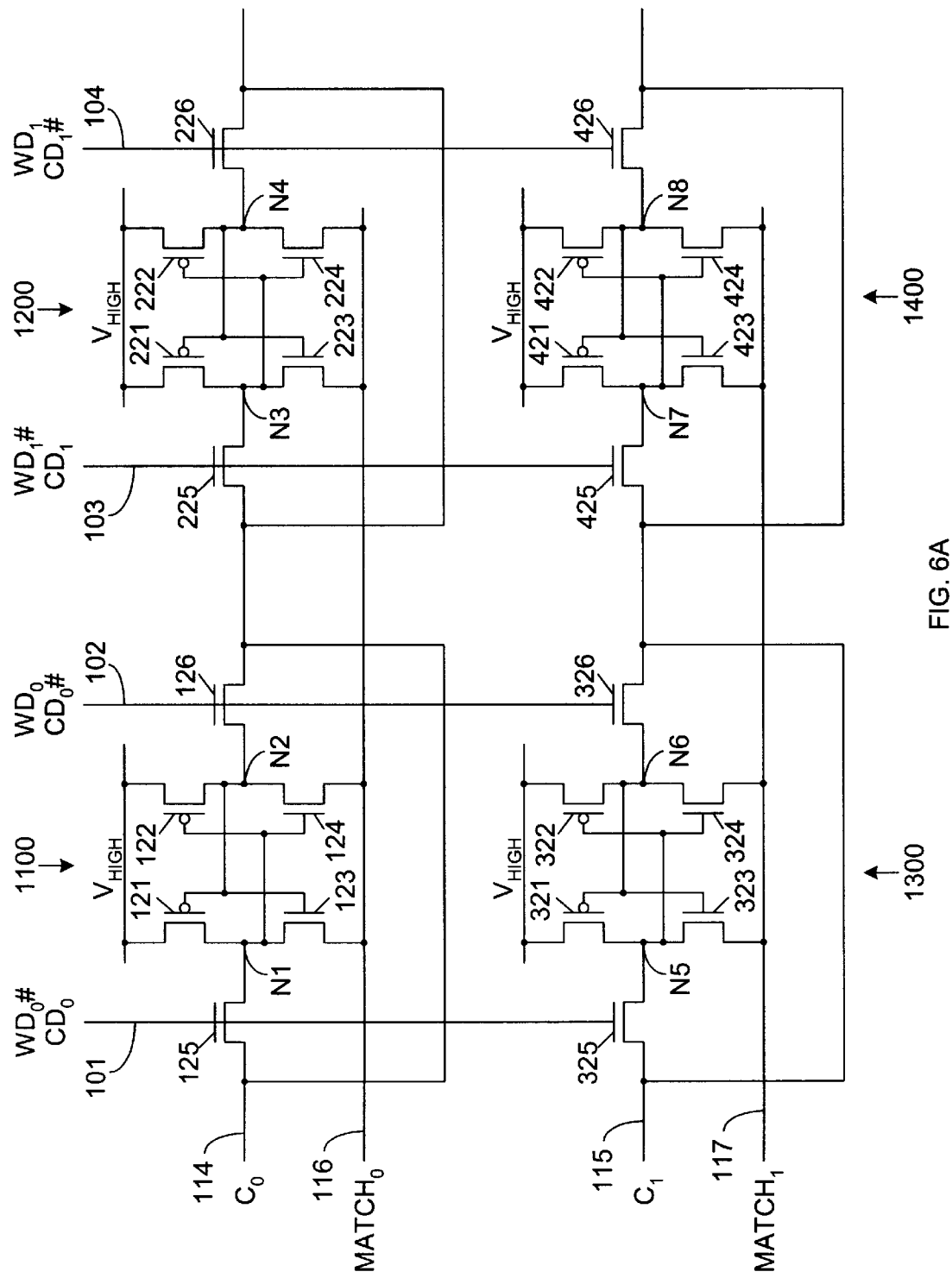
FIG. 6A is a schematic diagram of an array of six-transistor CAM cells in accordance with another embodiment of the present invention.

FIG. 6A is a schematic diagram of an array of six-transistor CAM cells 1100, 1200, 1300 and 1400 in accordance with another embodiment of the present invention. Similar elements in CAM cells 100, 200, 300 and 400 (FIG. 3A) and CAM cells 1100, 1200, 1300, and 1400 are labeled with similar reference numbers. Thus, CAM cells 1100, 1200, 1300, and 1400 include p-channel transistors 121–122, 221–222, 321–322 and 421–422 and n-channel transistors 123–126, 223–226, 323–326 and 423–426, which are coupled substantially as described above. CAM cells 1100, 1200, 1300 and 1400 further include column data lines 101–104, match lines 116–117 and compare enable lines 114–115. Note that in CAM cell 1100, the sources of transistors 123 and 124 are coupled to match line 116, rather than to $V_{LOW}$. Match line 116 is coupled to each CAM cell in the row in the same manner. Thus, match line 116 is coupled to the sources of transistors 223 and 224. Also note that the compare enable line 114 is connected in the same manner as match line 110 (FIG. 3A).

Although the array illustrated in FIG. 6A only has two rows and two columns of CAM cells, it is understood that this array can be expanded to include many more rows and columns of CAM cells. The manner of expansion is obvious in view of the 2×2 array of CAM cells 1100, 1200, 1300 and 1400 shown in FIG. 6A. In a particular example, an array of CAM cells includes six rows and fifty-four columns of CAM cells.

The operation of CAM cells 1100, 1200, 1300 and 1400 is similar to that of CAM cells 100, 200, 300 and 400 shown in FIG. 3A. During normal operation, CAM cells 1100, 1200, 1300 and 1400 are placed in standby, write, no-disturb and compare conditions.

During a standby condition, column data lines 101–104 are set to a logic low value of 0 Volts, thereby isolating CAM cells 1100, 1200, 1300 and 1400 from compare enable lines 114 and 115. Match lines 116–117 are held at a logic low value of 0 Volts, and $V_{HIGH}$ is held to a logic high value of $V_{CC}$. Compare enable lines 114–115 can be held at either a logic low value of 0 Volts or a logic high value of $V_{CC}$.

A write operation is performed as follows. The data values (and the associated inverse data values) to be written to a row of CAM cells are provided to column data lines 101–104. The match line associated with the row to be written is held at a voltage of 0 Volts, and the match lines associated with the rows that are not written are initially held to 0 Volts, and then either held at 0 Volts or allowed to float up to save power. The compare enable line of the written row is held at a voltage of 0 Volts, and the compare enable lines of the non-written rows are held to a voltage equal to the $V_{CC}$ supply voltage. For example, write data values $WD_0$ and $WD_1$ having logic "1" and "0" values, respectively, are written to a row of CAM cells (e.g., CAM cells 1100 and 1200) as follows. Write data values $WD_0$ and $WD_1$ are applied to column data lines 102 and 104, respectively. Inverse write data values $WD_0\#$ and $WD_1\#$ are applied to column data lines 101 and 103, respectively. Therefore, column data lines 101 and 104 are held at logic low values, and column data lines 102 and 103 are held at logic high values. Both compare enable line 114 and match line 116 are held to a logic low value of 0 Volts, and $V_{HIGH}$ is held to a logic high value of $V_{CC}$.

The logic high state of column data lines 102 and 103 turn on transistors 126 and 225, thereby placing the logic low value on compare enable line 114 at nodes N2 and N3. The logic low voltage applied to nodes N2 and N3 turn on p-channel transistors 121 and 222, respectively. As a result, nodes N1 and N4 are pulled up to a logic high state. The high voltages on nodes N1 and N4 turn on transistors 124 and 223. As a result, nodes N2 and N3 are pulled down to a logic low state. In the described example, write data values $WD_0$, $WD_0\#$, $WD_1$, and $WD_1\#$ have values of $V_{CC}$, 0, 0, and $V_{CC}$, respectively. Therefore, nodes N1, N2, N3 and N4 store write data values $WD_0$, $WD_0\#$, $WD_1$, and $WD_1\#$, respectively. After write data values $WD_0$, $WD_0\#$, $WD_1$, and $WD_1\#$ have had sufficient time to be latched into CAM cells 1100, 1200, logic low voltages are applied to lines 101–104, thereby turning off access transistors 126 and 225 and latching the write data values $WD_0$, $WD_0\#$, $WD_1$, and $WD_1\#$ into CAM cells 1100 and 1200. That is, CAM cells 1100, 1200, 1300, 1400 are then reset to a standby condition.

Note that while write data values $WD_0$ and $WD_1$ are written to CAM cells 1100 and 1200, the non-written rows (e.g., CAM cells 1300 and 1400) are held in a no-disturb condition. To maintain row 1 (e.g., CAM cells 1300 and 1400) in a no-disturb condition while is written, compare enable line 115 is held at a logic high voltage of $V_{CC}$. Match line 117 is held to an initial logic low value of 0 Volts and then either held low or allowed to float up to save power. $V_{HIGH}$ is held to a logic high value of $V_{CC}$.

The logic high state of column data lines 102 and 103 turn on transistors 326 and 425. If node N6 is initially latched in a logic high state, then the $V_{CC}$ voltage on compare enable line 115, being a logic high voltage, will not disturb the state of CAM cell 1300. Similarly, if node N7 is initially latched in a logic high state, then the $V_{CC}$ voltage on compare enable line 115, being a logic high voltage, will not disturb the state of CAM cell 1400. Moreover, if node N6 is initially latched in a logic low state, then both access transistor 326 and transistor 324 are turned on. The cell ratio of transistors 326 and 324 is chosen so that the voltage of node N6 in this configuration is not high enough to turn on transistor 323, thereby preventing the write operation of CAM cell 1100 from disturbing the contents of CAM cell 1300. The cell ratio of the transistors in each of cells 1100–1400 are similarly chosen so that write operations minimally affect non-written rows.

A comparison operation is performed as follows. The data values (and the associated inverse data values) to be compared to each row of CAM cells are provided to column data lines 101–104. The compare enable lines are held to logic high values. The match lines are initially held to logic low values. A compare operation is simultaneously performed within each CAM cell of the array. For example, the data values stored in CAM cells 1100 and 1200 (e.g. 1 and 0) are compared with compare data values $CD_0$ and $CD_1$ (e.g. 1 and 1) as follows. For purposes of clarity, a compare operation within CAM cells 1100 and 1200 is described in detail. The compare operations performed within CAM cells 1300 and 1400 are performed in a similar manner to the compare operations performed within CAM cells 1100 and 1200.

Compare data values $CD_0$ and $CD_1$ are applied to column data lines 101 and 103, respectively (and inverted compare data values $CD_0\#$ and $CD_1\#$ are provided to column data lines 102 and 104, respectively). In the described example, compare data values $CD_0$ and $CD_1$ are both logic high values. Compare enable line 114 is held to a logic high value and match line 116 is held initially to a logic low value. Under these conditions, the data value stored in CAM cell 1100 matches the compare data value $CD_0$, but the data value stored in CAM cell 1200 does not match the compare data value $CD_1$.

Column data lines 101 and 103 are coupled to receive compare data values $CD_0$ and $CD_1$, respectively. Column data lines 102 and 104 are coupled to receive inverse compare data values $CD_0\#$ and $CD_1\#$, respectively. Compare enable lines 114 and 115 are held at a logic high value of $V_{CC}$, match lines 116 and 117 are initially set to a logic low value of 0 Volts, and $V_{HIGH}$ is held to a logic high value of $V_{CC}$.

Within CAM cell 1100, the logic high compare data value $CD_0$ turns on transistor 125, thereby coupling node N1 to compare enable line 114. Node N1 is de-coupled from match line 116 by turned off transistor 123. Therefore, the logic high compare enable line 114 does not tend to change the voltage on match line 116 through node N1. Also within CAM cell 1100, node N2 is coupled to match enable line 116 through turned on transistor 124. The logic low compare data value $CD_0\#$ turns off transistor 126, thereby de-coupling node N2 from compare enable line 114. As a result, compare enable line 114 does not affect match line 116 through node N2. If all of the CAM cells in the row match all of the compare data values, match line 116 will remain at a logic low voltage, thereby indicating that a match condition exists.

However, as described above, the logic low data value stored in CAM cell 1200 does not match the logic high compare data value $CD_1$. Within CAM cell 1200, the logic high compare data value $CD_1$ causes transistor 225 to turn on, thereby coupling node N3 to compare data line 114. Node N3 is coupled to match line 116 through turned on transistor 223. As a result, the logic low voltage on match line 116 is pulled up. In the described embodiment, the voltage on match line 116 swings from 0 to 1.3 Volts. This increased voltage on match line 116 is interpreted as a non-match condition by a voltage sensor circuit (not shown). Note that match line 110 (FIG. 3A) is pulled down from a logic high value upon a non-match condition. In contrast, match line 116 (FIG. 6A) is pulled up from a logic low value upon a non-match condition.

The data values stored in CAM cells 1300 and 1400 are compared to the data values on column data lines 101–104 in a similar fashion, and the resulting voltage on match line 117 is sensed for a match/non-match condition. CAM cells 1100, 1200, 1300 and 1400 are then reset to a standby condition.

Figure 6B:
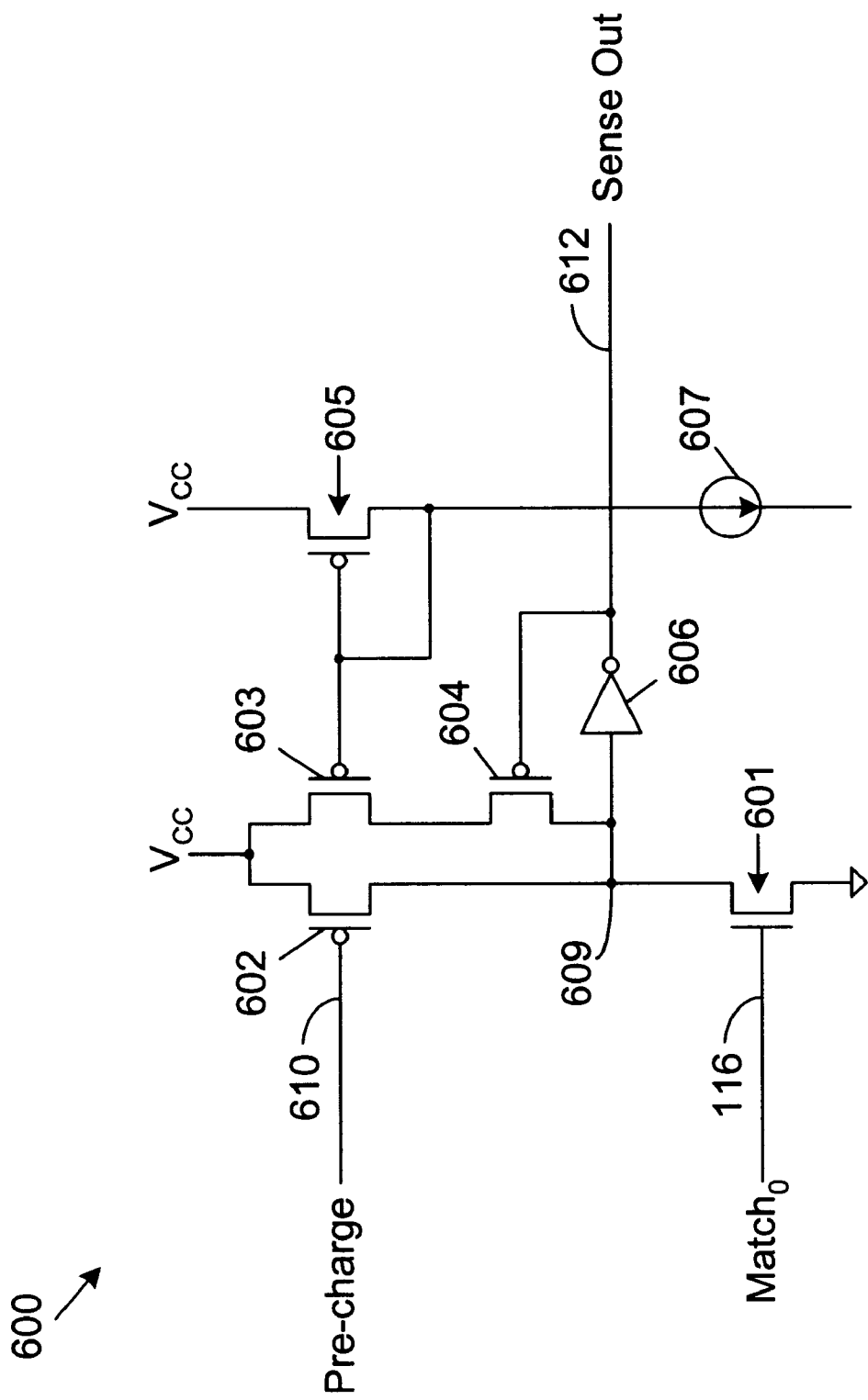
FIG. 6B is a schematic diagram of a sense amplifier for use with the CAM cell array of FIG. 6A.

FIG. 6B is a schematic diagram of a sense amplifier for use with the CAM cell array of FIG. 6A. The sense amplifier of FIG. 6B includes n-channel transistor 601, p-channel transistors 602–605, inverter 606 and current source 607. Transistors 601–602 are coupled in series between the $V_{CC}$ supply voltage and ground. Between transistors 601 and 602 is node 609. The gate of transistor 601 is coupled to match line 116 (FIG. 6A). The gate of transistor 602 is coupled to pre-charge line 610. Transistors 603–604 are coupled in series between the $V_{CC}$ supply voltage and node 609. Inverter 606 is coupled between node 609 and sense out line 612. The gate of transistor 604 is coupled to sense out line 612. Transistor 605 is coupled between the $V_{CC}$ supply voltage and current source 607. The gate of transistor 605 is coupled to the drain of transistor 605 and to the gate of transistor 603.

As noted above, match line 116 is initially held to a voltage equal to the $V_{SS}$ ground voltage. Match line 116 remains at the ground voltage if a match condition exists, and the voltage on match line 116 is pulled up for a non-match condition.

Sense amplifier 600 senses the voltage on match line 116 as follows. Pre-charge line 610 is held to a ground voltage prior to the sense operation. The ground voltage on pre-charge line 610 turns on p-channel transistor 602, coupling node 609 to the $V_{CC}$ supply voltage. The high voltage at node 609 is inverted by inverter 606. Thus, sense out line 612 is held to a ground voltage. The ground voltage on sense out line 612 turns on p-channel transistor 604. Current source 607 provides a constant current through transistor 605. Transistors 605 and 603 are configured as a current mirror, thereby translating the current through transistor 605 to series-connected transistors 603–604. Transistors 603 and turned on transistor 604 thereby help pull node 609 up to the $V_{CC}$ supply voltage.

To sense a match or non-match condition on match line 116 (FIG. 6A), pre-charge line 610 is taken to a logic high voltage, thereby turning off p-channel transistor 602. Match line 116 is initially held to a logic low value, indicating a match condition. Therefore, transistor 601 is initially turned off. If all CAM cells in an row of an array, e.g. row 0 of FIG. 6A, match the applied compare data values, then match line 116 will remain at a logic low value. As a result, transistor 601 will remain turned off, and node 609 will remain pulled up to the $V_{CC}$ supply voltage through transistors 603–604. The signal on sense out line 612 will remain at a logic low value, thereby indicating a match condition. However, if one of the CAM cells in row 0, e.g. CAM cell 1200, does not match the applied compare data value, the voltage on match line 116 will be pulled up to 1.3 Volts. The 1.3 Volts on match line 116 turns on n-channel transistor 601. The voltage of node 609 is pulled down through turned on transistor 601, causing inverter 606 to provide a high voltage to sense out line 612 and the gate of transistor 604. A small increase in voltage, e.g. 0.6–0.7 Volts, on the gate of transistor 604 will cause the voltage on node 609 to be pulled to ground quickly. As a result, the non-match condition is indicated by a logic high voltage on sense out line 612.

Figure 7:
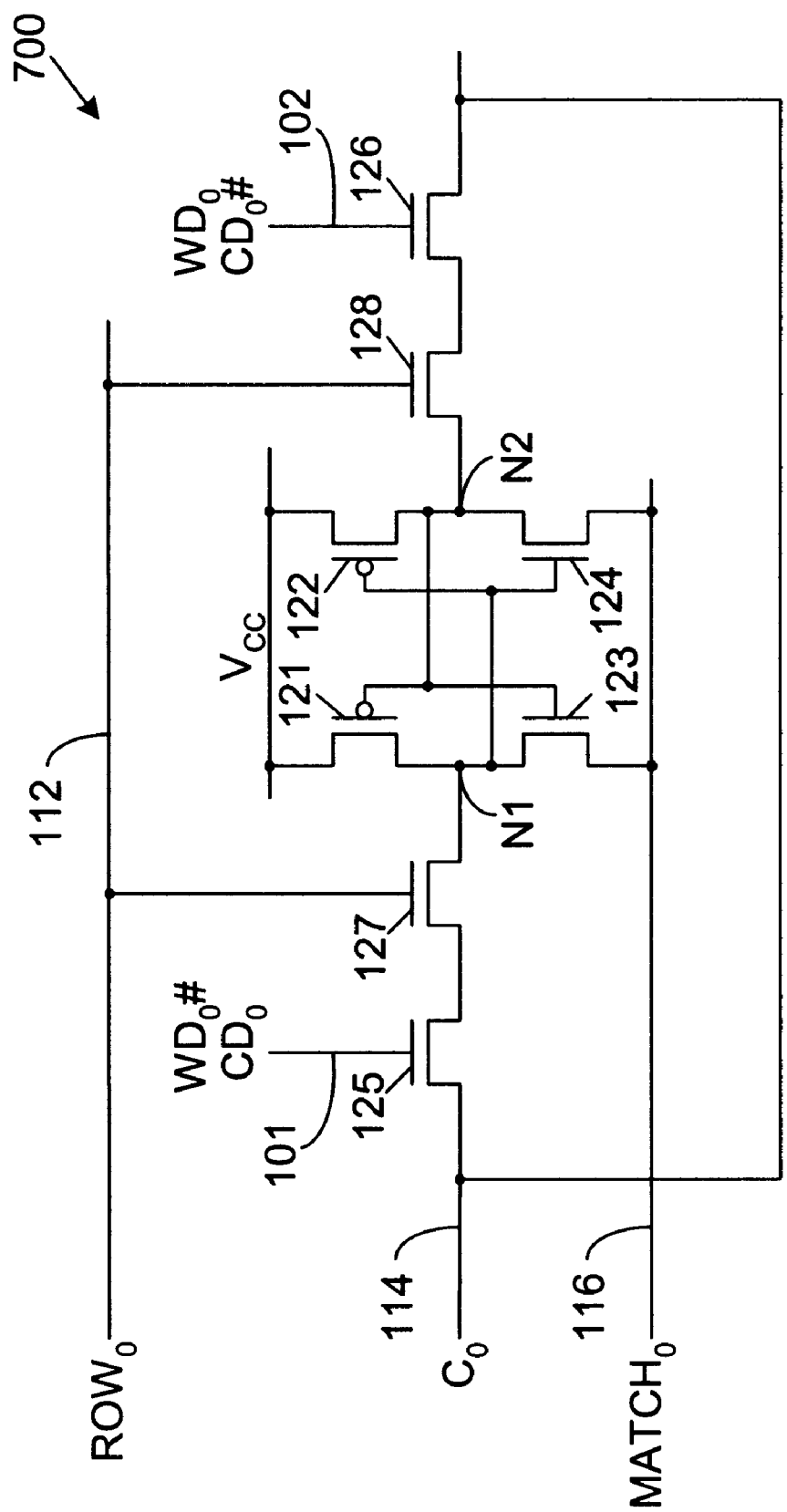
FIG. 7 is a schematic diagram of an 8-T CAM cell in accordance with one variation of the embodiment of FIG. 6A.

FIG. 7 is a schematic diagram of an 8-T CAM cell 700 in accordance with another variation of the present invention. Similar elements in CAM cell 1100 (FIG. 6A) and CAM cell 700 are labeled with similar reference numbers. CAM cell 700 includes the same elements as CAM cell 1100, with the addition of transistors 127–128 and row enable line 112. A plurality of CAM cells similar to CAM cell 700 may be connected in an array in the same fashion as CAM cells 1100, 1200, 1300 and 1400 (FIG. 6A).

CAM cell 700 operates in a manner similar to CAM cell 1100. However, a logic low voltage applied to row enable line 112 effectively disables CAM cell 700, while a logic high voltage applied to row enable line 112 effectively enables CAM cell 700.

Thus, during standby, row 0 is held to a logic low voltage, thereby turning off access transistors 127 and 128 to de-couple nodes N1 and N2 from column data lines 101 and 102 and compare enable line 114.

During a write operation, row 0 is held to a logic high value, thereby turning on access transistors 127 and 128. Under these conditions, CAM cell 700 operates in the same manner as CAM cell 1100.

The non-written rows are kept in a no-disturb state. In the no-disturb state, row 0 is held to a logic low voltage, thereby turning off access transistors 127 and 128 to de-couple nodes N1 and N2 from column data lines 101 and 102 and compare enable line 114.

During a compare operation, row 0 is held to a logic high value, thereby turning on access transistors 127 and 128. Under these conditions, CAM cell 700 operates in the same manner as CAM cell 1100.

8-T CAM cell 700 has an advantage over 6-T CAM cell 1100 (FIG. 6A) in that CAM cell 700 requires less power than CAM cell 1100 to perform a write operation with less chance of disturbing adjacent rows. 6-T CAM cell 1100 requires the compare enable lines of non-written rows to be held at logic high values. 8-T CAM cell 700 can disable non-written rows by grounding the associated row lines. Grounding a line consumes less power than holding a line to a logic high value.

Figure 8:
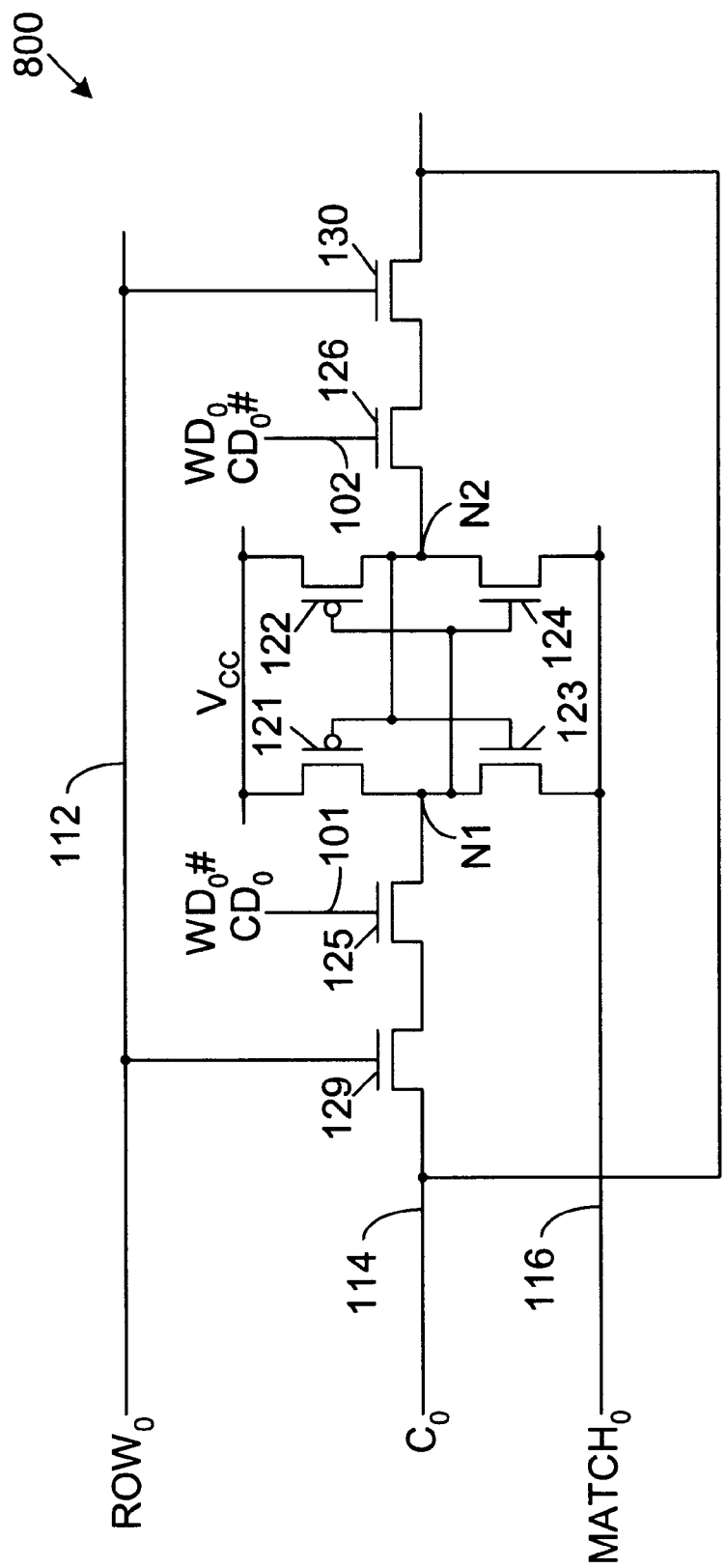
FIG. 8 is a schematic diagram of an 8-T CAM cell in accordance with another variation of the embodiment of FIG. 6A.

FIG. 8 is a schematic diagram of an 8-T CAM cell 800 in accordance with another variation of the present invention. Similar elements in CAM cell 1100 (FIG. 6A) and CAM cell 800 are labeled with similar reference numbers. CAM cell 800 includes the same elements as CAM cell 1100, with the addition of access transistors 129–130 and row enable line 112. Access transistors 129–130 are similar to access transistors 127–128 (FIG. 4), but are located outside of transistors 125–126, rather than inside of these transistors. Standby conditions and write and compare operations are performed in the same manner as with CAM cell 700 (FIG. 7). However, row enable line 112 and access transistors 129–130 operate to couple (logic high $ROW_0$ value) or de-couple (logic low $ROW_0$ value) transistors 125–126 to compare enable line 114.

Figure 9:
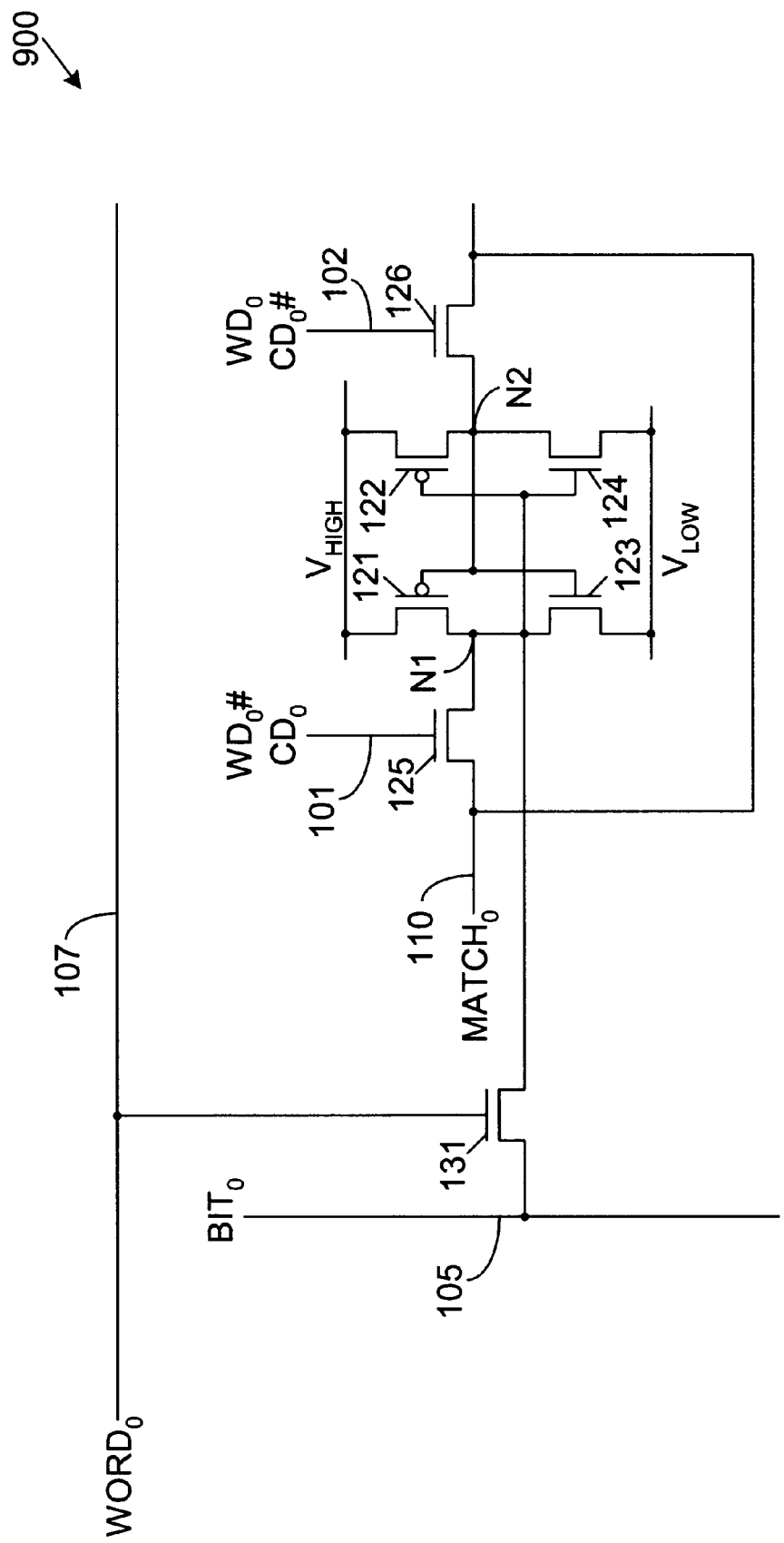
FIG. 9 is a schematic diagram of a 7-T CAM cell in accordance with another variation of the embodiment of FIG. 3A.

FIG. 9 is a schematic diagram of a 7-T CAM cell 900 in accordance with another variation of the present invention. Similar elements in CAM cell 100 (FIG. 3A) and CAM cell 900 are labeled with similar reference numbers. CAM cell 900 includes the same elements as CAM cell 100, with the addition of read access transistor 131, word line 107 and bit line 105. These additional elements allow CAM cell 900 to perform read operations, in addition to standby, write and compare operations. A plurality of CAM cells similar to CAM cell 900 may be connected in an array in the same fashion as CAM cells 100, 200, 300 and 400 (FIG. 3A). Note that word line 107 is coupled to a read access transistor in each CAM cell in the same row as CAM cell 900. Also note that bit line 105 is coupled to each CAM cell in the same column as CAM cell 900.

CAM cell 900 operates in a manner similar to CAM cell 100 during standby, write and compare operations. For each of these operations, word line 107 is held at a logic low voltage of 0 Volts. As a result, read access transistor 131 is turned off, thereby de-coupling bit line 105 from node N1. Bit line 105 may be held at a logic low voltage of 0 Volts or a logic high voltage of $V_{CC}$, but $V_{CC}$ is preferred. Under these conditions, standby, write and compare operations are performed as described for CAM cell 100.

Additionally, it is possible to read the data stored by CAM cell 900. A read operation is performed as follows. A logic high value is applied to the word line of the row to be read, thereby turning on the read access transistors associated with this word line. Under these conditions, each CAM cell in the selected row is coupled to a corresponding bit line through it's corresponding read access transistor. The bit lines are all initially held to a logic high value. A CAM cell having a stored logic value of "1" will tend to keep the voltage constant on the bit line. A CAM cell having a stored logic value of "0" will tend to pull down the voltage on the bit line. The voltage on each bit line may be sensed to determine the contents of each CAM cell. For example, as described above, if CAM cell 900 stores a logic "1" value then node N1 will store a high logic value and node N2 will store a low logic value. Word line 107 and bit line 105 will be held to logic high values. The high voltage on word line 107 will turn on read access transistor 131, thereby coupling node N1 to bit line 105. The logic high value stored at node N1 will not tend to decrease the logic high voltage of bit line 105. The logic high voltage of bit line 105 will indicate that a logic "1" value is stored in CAM cell 900. However, if CAM cell 900 stores a logic "0" value, then node N1 will store a low logic value and node N2 will store a high logic value. The high voltage on word line 107 will turn on read access transistor 131, coupling bit line 105 to node N1. In this case, the low voltage stored in node N1 will tend to pull down the voltage on bit line 105, thereby indicating that a logic "0" value is stored in CAM cell 900.

Figure 10:
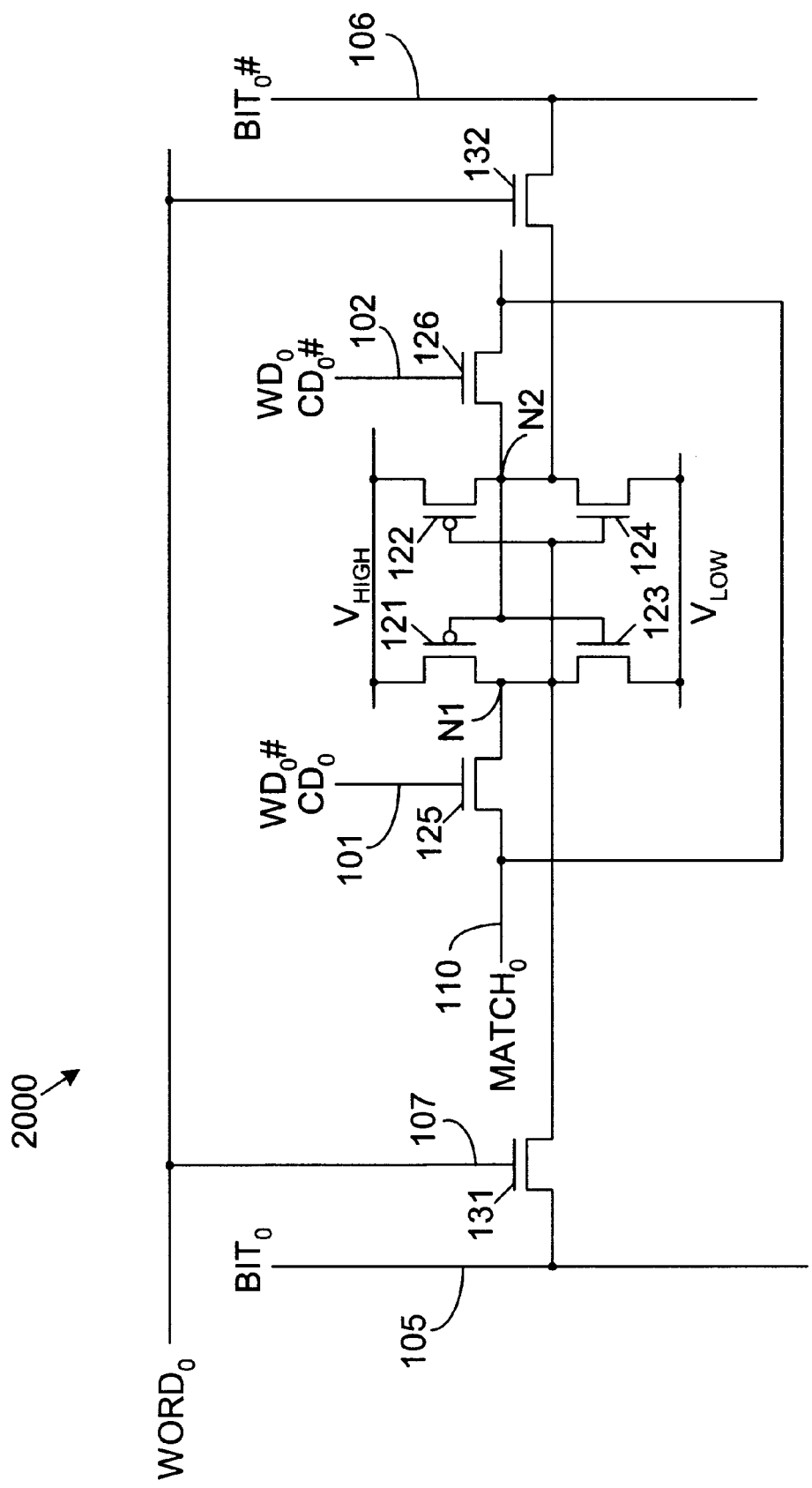
FIG. 10 is a schematic diagram of an 8-T CAM cell in accordance with another variation of the embodiment of FIG. 3A.

FIG. 10 is a schematic diagram of an 8-T CAM cell 2000 in accordance with another variation of the present invention. Similar elements in CAM cell 900 (FIG. 9) and CAM cell 2000 are labeled with similar reference numbers. CAM cell 2000 includes the same elements as CAM cell 900, with the addition of read access transistor 132 and inverse bit line 106. A plurality of CAM cells similar to CAM cell 2000 may be connected in an array in the same fashion as CAM cells 100, 200, 300 and 400 (FIG. 3A). Note that word line 107 is coupled to two read access transistors in each CAM cell in the same row as CAM cell 2000. Also note that bit line 105 and inverse bit line 106 are coupled to each CAM cell in the same column as CAM cell 2000.

CAM cell 2000 operates in a manner similar to CAM cell 900 during standby, write and compare operations. For each of these operations, as with CAM cell 900, word line 107 is held at a logic low voltage of 0 Volts. As a result, read access transistors 131–132 are turned off, thereby de-coupling bit line 105 and inverse bit line 106 from nodes N1 and N2, respectively. Bit line 105 and inverse bit line 106 may be held at logic low voltages of 0 Volts or logic high voltages of $V_{CC}$, but $V_{CC}$ is preferred. Under these conditions, standby, write and compare operations are performed as described for CAM cell 100.

A read operation also is performed in a manner similar to that of CAM cell 900. However, both the data value and the inverse data value stored by CAM cell 2000 are read. The column data lines are held to a logic low value, turning off the associated write/compare access transistors. The logic high value applied to the word line of the row to be read turns on the associated access transistors, thereby coupling each node to a bit line or inverse bit line. For example, if CAM cell 2000 stores a logic "1" value then node N1 will store a high logic value and node N2 will store a low logic value. Word line 107 and bit lines 105–106 will be held at logic high values. The high voltage on word line 107 will turn on read access transistors 131–132, thereby coupling nodes N1 and N2 to bit line 105 and inverse bit line 106, respectively. The logic high value stored at node N1 will not tend to decrease the logic high voltage of bit line 105. However, the logic low value stored at node N2 will tend to decrease the voltage of inverse bit line 106. A conventional differential sense amplifier (not shown) is coupled across bit line 105 and inverse bit line 106. This differential sense amplifier detects a positive voltage difference between bit line 105 and inverse bit line 106, thereby identifying a logic high value stored in CAM cell 2000.

Figure 11:
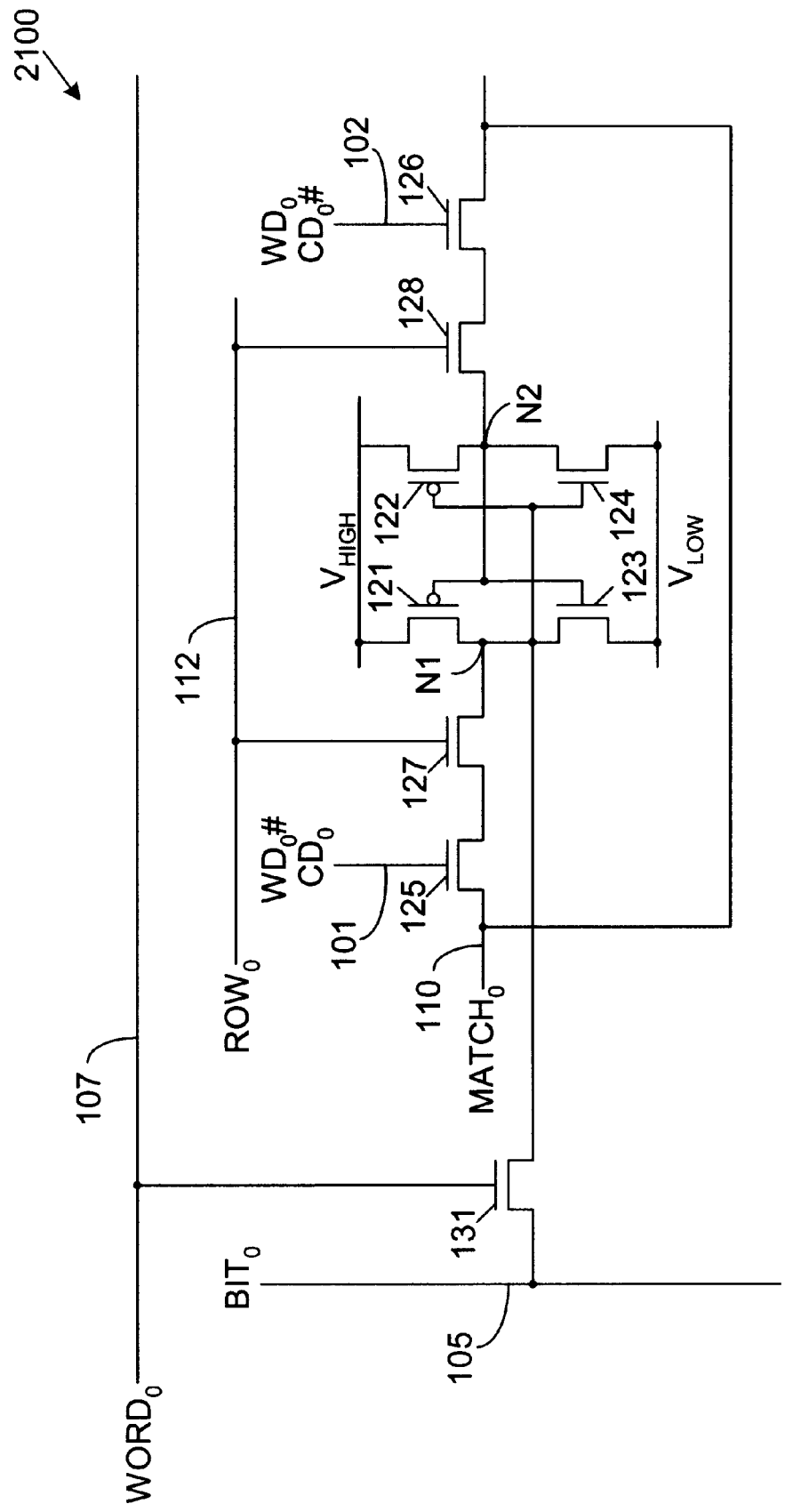
FIG. 11 is a schematic diagram of a 9-T CAM cell in accordance with another variation of the embodiment of FIG. 3A.

FIG. 11 is a schematic diagram of a 9-T CAM cell 2100 in accordance with another variation of the present invention. Similar elements in CAM cell 500 (FIG. 4) and CAM cell 2100 are labeled with similar reference numbers. CAM cell 2100 includes the same elements as CAM cell 500 (FIG. 4), with the addition of read access transistor 131, word line 107 and bit line 105. These additional elements allow CAM cell 2100 to perform read operations, in addition to standby, write and compare operations. A plurality of CAM cells similar to CAM cell 2100 may be connected in an array in the same fashion as CAM cells 100, 200, 300 and 400 (FIG. 3A).

CAM cell 2100 operates in a manner similar to CAM cell 500 during standby, write and compare operations. For each of these operations, word line 107 is held at a logic low voltage of 0 Volts. As a result, read access transistor 131 is turned off, thereby de-coupling bit line 105 from node N1. Bit line 105 may be held at a logic low voltage of 0 volts or a logic high voltage of $V_{CC}$, but $V_{CC}$ is preferred. Under these conditions, standby, write and compare operations are performed as described for CAM cell 500.

Additionally, it is possible to read the data stored by CAM cell 2100. A read operation is performed in a manner similar to that of CAM cell 900 (FIG. 9). The column data lines are held to a logic low value, de-coupling access transistors 127–128 from match line 110. Row access line 112 may be held at a logic low value of 0 Volts or a logic high value of $V_{CC}$. Under these conditions, the read operation of CAM cell 2100 is the same as that of CAM cell 900 (FIG. 9).

In one variation of the present embodiment, access transistors 127–128 are coupled instead between match line 110 and access transistors 125–126, respectively, in the same manner as access transistors 129–130 in FIG. 5.

Figure 12:
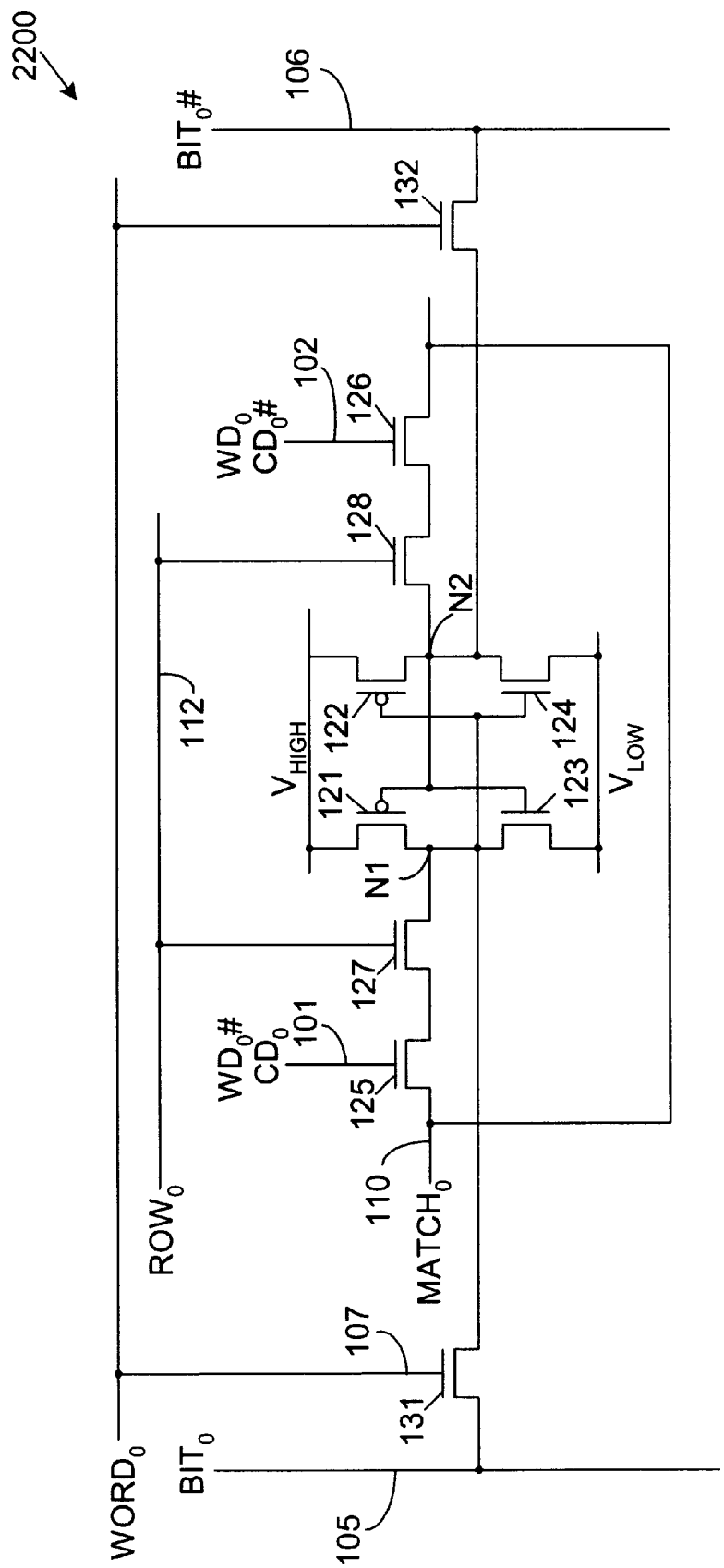
FIG. 12 is a schematic diagram of a 10-T CAM cell in accordance with another variation of the embodiment of FIG. 3A.

FIG. 12 is a schematic diagram of a 10-T CAM cell 2200 in accordance with another variation of the present invention. Similar elements in CAM cell 2100 (FIG. 11) and CAM cell 2200 are labeled with similar reference numbers. CAM cell 2200 includes the same elements as CAM cell 2100, with the addition of read access transistor 132 and inverse bit line 106. A plurality of CAM cells similar to CAM cell 2200 may be connected in an array in the same fashion as CAM cells 100, 200, 300 and 400 (FIG. 3A).

CAM cell 2200 operates in a manner similar to CAM cell 2100 during standby, write and compare operations. For each of these operations, as with CAM cell 2100, word line 107 is held at a logic low voltage of 0 Volts. As a result, read access transistors 131–132 are turned off, thereby de-coupling bit line 105 and inverse bit line 106 from nodes N1 and N2, respectively. Bit line 105 and inverse bit line 106 may be held at logic low voltages of 0 Volts or logic high voltages of $V_{CC}$, but $V_{CC}$ is preferred. Under these conditions, standby, write and compare operations are performed as described for CAM cell 500 (FIG. 4).

A read operation also is performed in a manner similar to that of CAM cell 2100. However, both the data value and the inverse data value stored by CAM cell 2200 are read. The column data lines are held to logic low values, turning off the associated write/compare access transistors. As a result, access transistors 127–128 are de-coupled from match line 110. Under these conditions, a read operation is performed as described for CAM cell 2000 (FIG. 10).

In a variation of the present embodiment, access transistors 127–128 are coupled instead between compare data line 114 and access transistors 125–126, respectively, as shown by access transistors 129–130 in FIG. 5.

Figure 13:
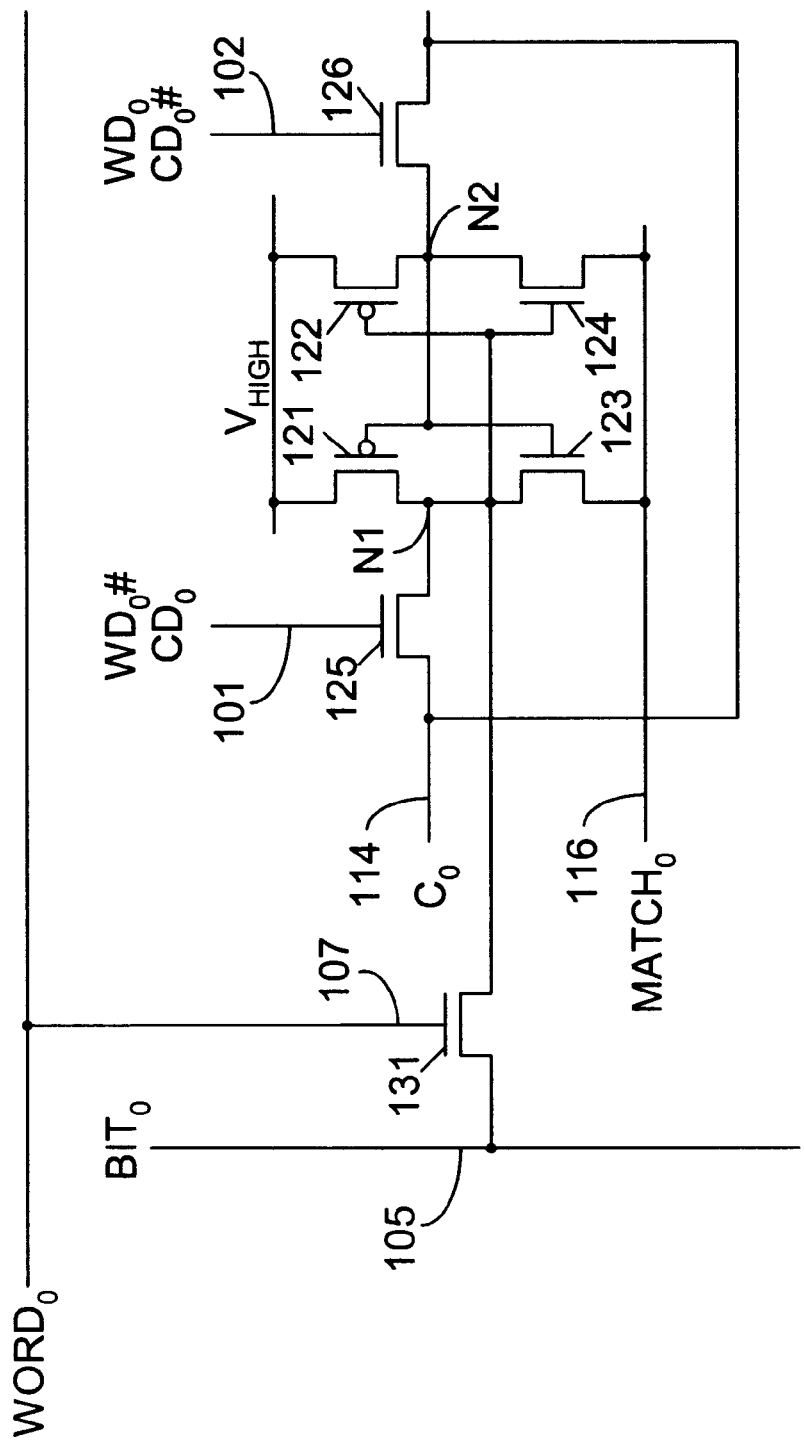
FIG. 13 is a schematic diagram of a 7-T CAM cell in accordance with another variation of the embodiment of FIG. 6A.

FIG. 13 is a schematic diagram of a 7-T CAM cell 2300 in accordance with another variation of the present invention. Similar elements in CAM cell 1100 (FIG. 6A) and CAM cell 2300 are labeled with similar reference numbers. CAM cell 2300 includes the same elements as CAM cell 1100, with the addition of read access transistor 131, word line 107 and bit line 105. These additional elements allow CAM cell 2300 to perform read operations, in addition to standby, write and compare operations. A plurality of CAM cells similar to CAM cell 2300 may be connected in an array in the same fashion as CAM cells 1100, 1200, 1300 and 1400 (FIG. 6A).

CAM cell 2300 operates in a manner similar to CAM cell 1100 during standby, write and compare operations. For each of these operations, word line 107 is held at a logic low voltage of 0 Volts. As a result, read access transistor 131 is turned off, thereby de-coupling bit line 105 from node N1. Bit line 105 may be held at a logic low voltage of 0 Volts or a logic high voltage of $V_{CC}$, but $V_{CC}$ is preferred. Under these conditions, standby, write and compare operations are performed as described for CAM cell 1100 (FIG. 6A).

Additionally, it is possible to read the data stored by CAM cell 2300. A read operation is performed in a manner similar to that of CAM cell 900 (FIG. 9). The column data lines are held to a logic low value, de-coupling access transistors 125–126 from compare data line 114. Match line 116 is held to a logic low value. Under these conditions, the read operation of CAM cell 2300 is the same as that of CAM cell 900 (FIG. 9).

Although the present invention has been described in connection with particular embodiments, other embodiments are possible and are considered to be within the scope of the present invention. For example, the row enable line 112 and access transistors 127–128 of FIG. 7 could be coupled between access transistors 125–126 and nodes N1 and N2, respectively. In another example, the row enable line 112 and access transistors 129–130 of FIG. 8 could be coupled between compare data line 114 and access transistors 125–126, respectively.

Figure 14:
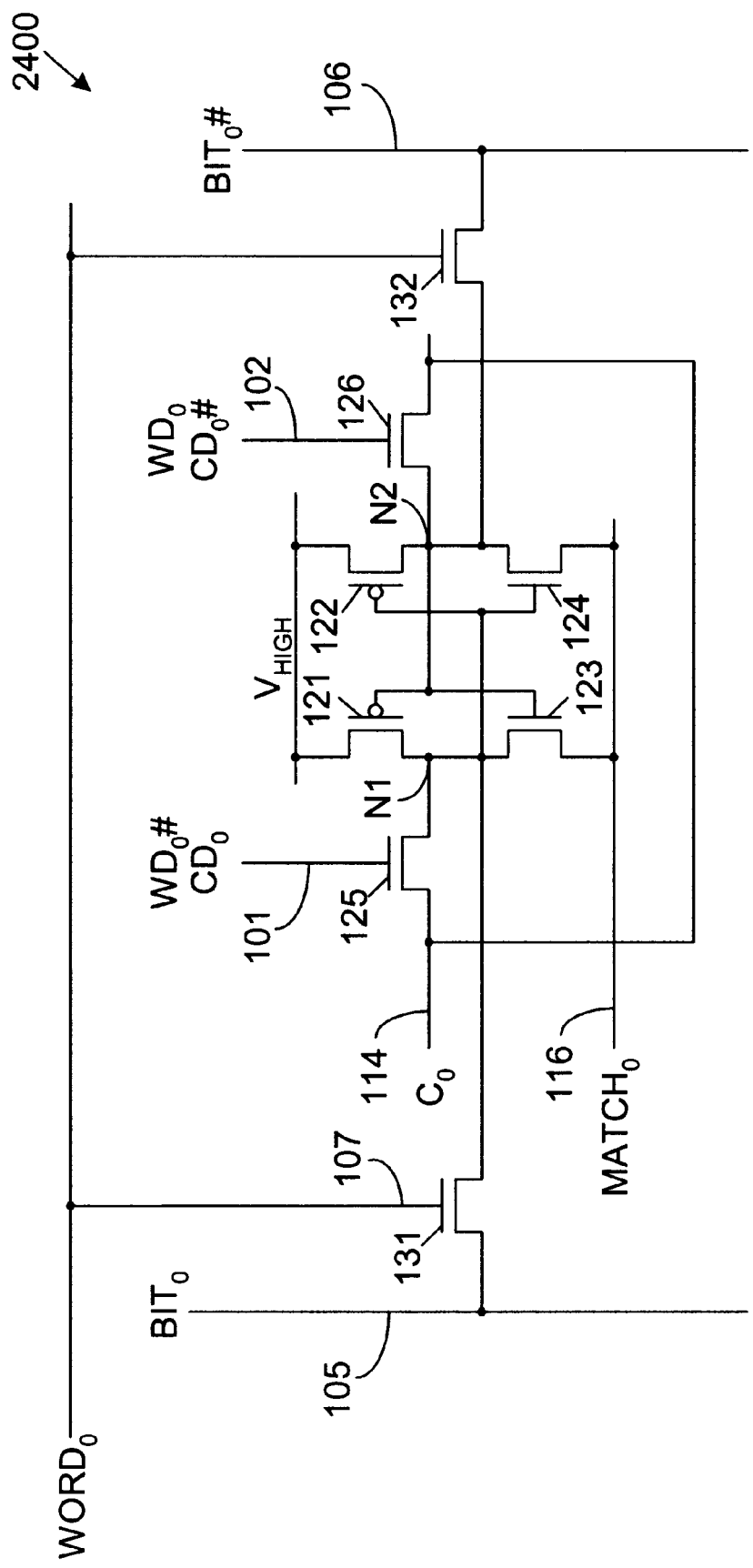
FIG. 14 is a schematic diagram of an 8-T CAM cell in accordance with another variation of the embodiment of FIG. 6A.

FIG. 14 is a schematic diagram of an 8-T CAM cell 2400 in accordance with another variation of the present invention. Similar elements in CAM cell 2300 (FIG. 13) and CAM cell 2400 are labeled with similar reference numbers. CAM cell 2400 includes the same elements as CAM cell 2300, with the addition of read access transistor 132 and inverse bit line 106. A plurality of CAM cells similar to CAM cell 2400 may be connected in an array in the same fashion as CAM cells 1100, 1200, 1300 and 1400 (FIG. 6A).

CAM cell 2400 operates in a manner similar to CAM cell 1100 during standby, write and compare operations. For each of these operations, as with CAM cell 2300, word line 107 is held at a logic low voltage of 0 Volts. As a result, read access transistors 131–132 are turned off, thereby de-coupling bit line 105 and inverse bit line 106 from nodes N1 and N2, respectively. Bit line 105 and inverse bit line 106 may be held at logic low voltages of 0 Volts or logic high voltages of $V_{CC}$, but $V_{CC}$ is preferred. Under these conditions, standby, write and compare operations are performed as described for CAM cell 1100 (FIG. 6A).

A read operation also is performed in a manner similar to that of CAM cell 2300. However, both the data value and the inverse data value stored by CAM cell 2400 are read. The column data lines are held to a logic low value, turning off the associated write/compare access transistors. As a result, access transistors 125–126 are de-coupled from compare data line 114. Under these conditions, a read operation is performed as described for CAM cell 2200 (FIG. 12).

Although the present invention has been described in connection with particular embodiments, other embodiments are possible and are considered to be within the scope of the present invention. For example, the row enable line 112 and access transistors 127–128 of FIG. 7 could be coupled between access transistors 125–126 and nodes N1 and N2, respectively. In another example, the row enable line 112 and access transistors 129–130 of FIG. 8 could be coupled between compare data line 114 and access transistors 125–126, respectively.

Figure 15:
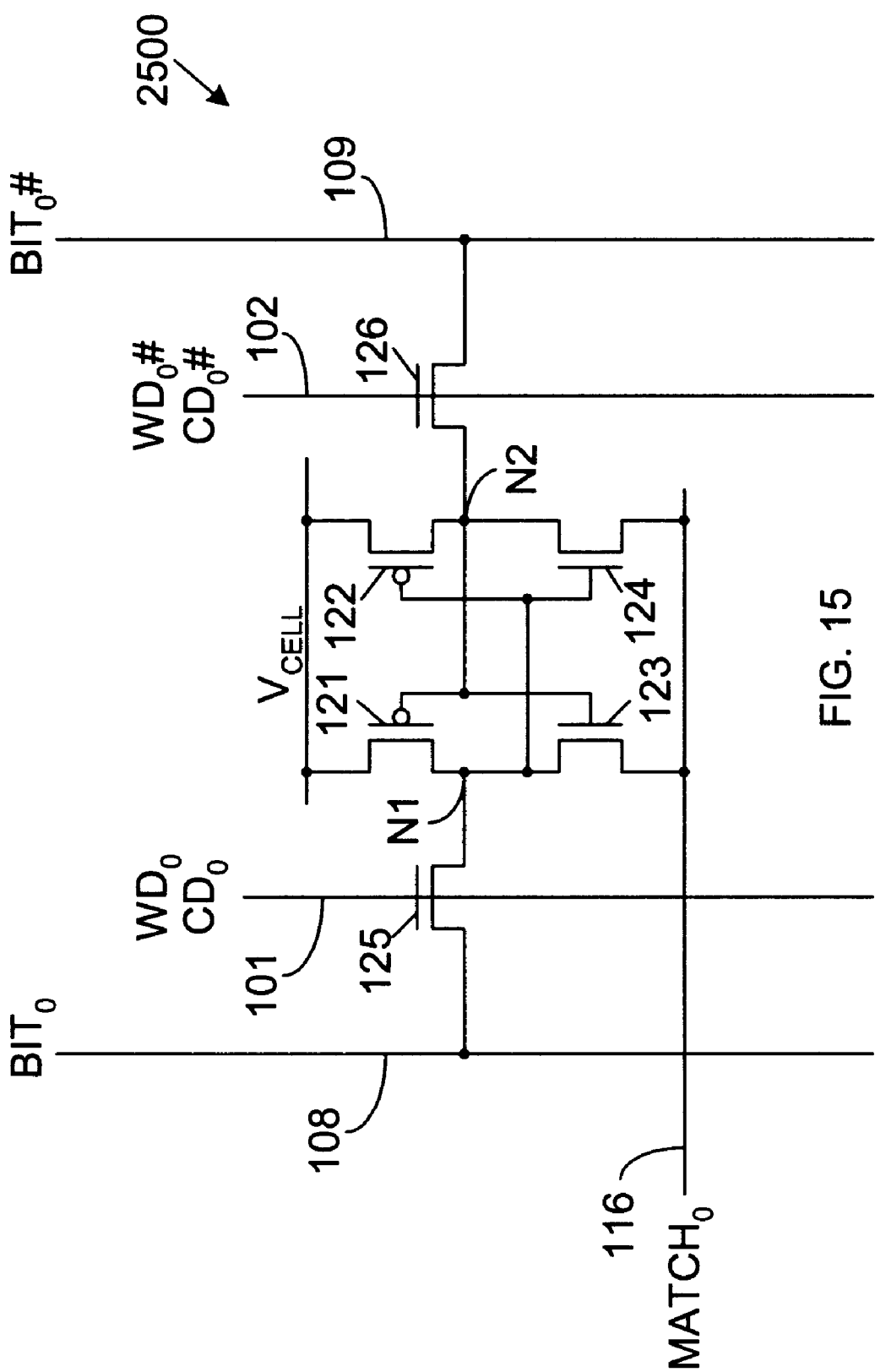
FIG. 15 is a schematic diagram of six-transistor CAM cell in accordance with another embodiment of the present invention.

FIG. 15 is a schematic diagram of six-transistor CAM cell 2500 in accordance with another embodiment of the present invention. Similar elements in CAM cells 1100 (FIG. 6A)

and CAM cell 2500 are labeled with similar reference numbers. CAM cell 2500 includes column data lines 101–102, match line 116, bit line 108, inverse bit line 109, p-channel transistors 121–122, and n-channel transistors 123–126, which are coupled substantially as described above. Note that match line 116 is coupled to each CAM cell in the row in the same manner. Also note that column data lines 101–102 are coupled to each CAM cell in the same column as CAM cell 2500. 1 The operation of CAM cell 2500 is similar to that of CAM cell 1100 shown in FIG. 6A, with the additional ability to read the contents of CAM cell 2500. During normal operation, CAM cell 2500 is placed in various conditions, including standby, write, no-disturb, read and compare. During a standby condition, column data lines 101–102 are set to a logic low value of 0 Volts, thereby isolating CAM cell 2500 from bit line 108 and inverse bit line 109. Match line 116 is held at a logic low value of 0 Volts, and $V_{HIGH}$ is held to a logic high value of $V_{CC}$.

A write operation is performed as follows. The data values (and the associated inverse data values) to be written to a row of CAM cells are provided to column data lines 101–102. $V_{CELL}$ is preferably less than $V_{CC}$ less $V_{TB}$ for the written row. $V_{TB}$ is defined as the back biased threshold voltage. $V_{CELL}$ is equal to $V_{CC}$ for the non-written rows. The match line associated with the row to be written is held at a voltage of $V_{CC}$-$2V_{TB}$ or lower (but always greater than 0 Volts) depending on the cell ratio. The match lines associated with the rows that are not written are held to a voltage equal to $V_{CC}$ less $V_{TB}$. The bit line and inverse bit line are held at a logic high value of $V_{CC}$. For example, write data value $WD_0$, having a logic "1" value ($V_{CC}$), is written to a row of CAM cells (e.g., CAM cell 2500) as follows. Write data value $WD_0$ is applied to column data line 101 and inverse write data value $WD_0\#$ is applied to column data line 102.

The logic high state of column data line 101 turns on transistor 125, thereby placing the logic high value on bit line 108 at node N1. At this time, the voltage on match line 116 is pulled lower and $V_{CELL}$ is pulled higher. The logic high voltage applied to node N1 is sufficient to turn on n-channel transistor 124. As a result, node N2 is pulled to the voltage of match line 116. The voltage on match line 116 is sufficiently small enough to turn on p-channel transistor 121, thereby coupling node N1 to the $V_{CELL}$ voltage. As a result, write data values $WD_0$ and $WD_0\#$ are latched at nodes N1 and N2, respectively. After write data values $WD_0$ and $WD_0\#$ have had sufficient time to be latched into CAM cell 2500, logic low voltages are applied to lines 101–102, thereby turning off access transistors 125 and 126 and latching the write data values $WD_0$ and $WD_0\#$ into CAM cell 2500. That is, CAM cell 2500 is then reset to a standby condition.

Note that while write data value $WD_0$ is written to CAM cell 2500, the non-written rows (not shown) are held in a no-disturb condition. To maintain CAM cell 2500 in a no-disturb condition while another row is written, match line 116 is held at a voltage of $V_{CC}$ less $V_{TB}$, and $V_{CELL}$ is held to a logic high voltage of $V_{CC}$. Under these conditions, a logic high write data value $WD_0$ will turn on access transistor 125, thereby placing the logic high value of bit line 108 less the threshold value $V_{TB}$ of transistor 125 at node N1. This voltage at node N1 is not high enough to turn on transistor 124, because match line 166 is also held to $V_{CC}$ less $V_{TB}$. As a result, node N2 remains at a logic high value through turned on transistor 122. After the write operation is complete, write data lines 101–102 are first grounded, and then match line 116 is grounded. As a result, the logic high value at node N2 remains unchanged, causing the logic low value at node N1 to remain unchanged. Therefore, the contents of non-written CAM cell 2500 are not disturbed by a write operation on another row in the CAM cell array.

A comparison operation is performed in a manner similar to that of CAM cell 1100 (FIG. 6A). However, rather than holding compare data line 114 to a logic high value, the bit line 108 and inverse bit line 109 are held to logic high values.

A read operation is performed on a row of CAM cells in the following manner. The column data lines are held to a logic high value, and the bit line is pre-charged to a logic high value. $V_{CELL}$ is held to a logic high value. The match line of the row to be read is held to a logic low voltage of 0 Volts, and the match line of the non-read rows is held to a voltage of $V_{CC}$ less $V_{TB}$.

The logic high voltage applied to column data line 101 turns on access transistor 125, thereby coupling node N1 to bit line 108. If CAM cell 2500 stores a logic "1" value, the high voltage at node N1 will not tend to change the voltage on bit line 108, indicating a stored logic value of "1". However, if CAM cell 2500 stores a logic "0" value, the low voltage at node N1 will tend to pull down the voltage on bit line 108, indicating a stored logic value of "0".

Although the present invention has been described in connection with particular embodiments, other embodiments are possible and are considered to be within the scope of the present invention. For example, the row enable line 112 and access transistors 127–128 of FIG. 7 could be coupled between access transistors 125–126 and nodes N1 and N2, respectively. Also, the row enable line 112 and access transistors 129–130 of FIG. 8 could be coupled between compare data line 114 and access transistors 125–126, respectively.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

I claim:

1. A content addressable memory (CAM) cell comprising:
   a pair of cross-coupled inverters forming a storage element having a first node and a second node, the first node storing a data value and the second node storing an inverse data value;
   a first access transistor having a source coupled to the first node;
   a second access transistor having a source coupled to the second node;
   a match line coupled to a drain of the first access transistor and a drain of the second access transistor;
   a first data line coupled to a gate of the first access transistor;
   a second data line coupled to a gate of the second access transistor;
   a voltage clamp circuit coupled to the match line, wherein the clamp circuit is configured to maintain a voltage on the match line at a voltage that prevents disturbance of the stored data value.

2. The CAM cell of claim 1, further comprising:
   a third access transistor coupled in series with the first access transistor;
   a fourth access transistor coupled in series with the second access transistor; and a row access line coupled to the gates of the third and fourth access transistors.

3. The CAM cell of claim 2, wherein the third access transistor is coupled between the first access transistor and the first node and the fourth access transistor coupled between the second access transistor and the second node.

4. The CAM cell of claim 2, wherein the third access transistor is coupled between the first access transistor and the match line and the fourth access transistor coupled between the second access transistor and the match line.

5. The CAM cell of claim 2, further comprising:
a first read access transistor having a source coupled to the first node;
a bit line coupled to a drain of the first read access transistor; and
a word line coupled to a gate of the first read access transistor.

6. The CAM cell of claim 5, further comprising:
a second read access transistor having a source coupled to the second node and a gate coupled to the word line; and
an inverse bit line coupled to a drain of the second read access transistor.

7. The CAM cell of claim 1, further comprising:
a first read access transistor having a source coupled to the first node;
a bit line coupled to a drain of the first read access transistor; and
a word line coupled to a gate of the first read access transistor.

8. The CAM cell of claim 7, further comprising:
a second read access transistor having a source coupled to the second node and a gate coupled to the word line; and
an inverse bit line coupled to a drain of the second read access transistor.

9. A content addressable memory (CAM) cell comprising:
a first voltage supply line and a ground voltage supply line;
a pair of cross-coupled inverters forming a storage element having a first node and a second node, the first node storing a data value and the second node storing an inverse data value, the cross-coupled inverters being coupled between the first voltage supply line and the ground voltage supply line;
a match line connected to the ground voltage supply line of the storage element;
a first access transistor having a source coupled to the first node;
a second access transistor having a source coupled to the second node;
a comparison line coupled to a drain of the first access transistor and a drain of the second access transistor;
a first data line coupled to the gate of the first access transistor; and
a second data line coupled to the gate of the second access transistor.

10. The CAM cell of claim 9, further comprising:
a third access transistor coupled in series with the first access transistor;
a fourth access transistor coupled in series with the second access transistor; and
a row access line coupled to the gates of the third and fourth access transistors.

11. The CAM cell of claim 10, wherein the third access transistor is coupled between the first access transistor and the first node and the fourth access transistor coupled between the second access transistor and the second node.

12. The CAM cell of claim 10, wherein the third access transistor is coupled between the first access transistor and the match line and the fourth access transistor coupled between the second access transistor and the match line.

13. The CAM cell of claim 10, further comprising:
a first read access transistor having a source coupled to the first node;
a bit line coupled to a drain of the first read access transistor; and
a word line coupled to a gate of the first read access transistor.

14. The CAM cell of claim 13, further comprising:
a second read access transistor having a source coupled to the second node and a gate coupled to the word line; and
an inverse bit line coupled to a drain of the second read access transistor.

15. The CAM cell of claim 9, further comprising:
a first read access transistor having a source coupled to the first node;
a bit line coupled to a drain of the first read access transistor; and
a word line coupled to a gate of the first read access transistor.

16. The CAM cell of claim 15, further comprising:
a second read access transistor having a source coupled to the second node and a gate coupled to the word line; and
an inverse bit line coupled to a drain of the second read access transistor.

17. A content addressable memory (CAM) cell comprising:
a first voltage supply line and a ground voltage supply line;
a pair of cross-coupled inverters forming a storage element having a first node and a second node, the first node storing a data value and the second node storing an inverse data value, the cross-coupled inverters being coupled between the first voltage supply line and the ground voltage supply line;
a match line coupled to the ground voltage supply line of the storage element;
a first access transistor having a source coupled to the first node;
a bit line coupled to a drain of the first access transistor;
a second access transistor having a source coupled to the second node;
an inverse bit line coupled to a drain of the second access transistor;
a first data line coupled to a gate of the first access transistor; and
a second data line coupled to a gate of the second access transistor.

* * * * *